(12) United States Patent
Kim

(10) Patent No.: US 11,694,994 B2
(45) Date of Patent: Jul. 4, 2023

(54) SEMICONDUCTOR CHIP STACK STRUCTURE, SEMICONDUCTOR PACKAGE, AND METHOD OF MANUFACTURING THE SAME

(71) Applicant: SAMSUNG ELECTRONICS CO., LTD., Suwon-si (KR)

(72) Inventor: Yongho Kim, Daegu (KR)

(73) Assignee: SAMSUNG ELEOTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/865,649

(22) Filed: May 4, 2020

(65) Prior Publication Data

US 2021/0066251 A1    Mar. 4, 2021

(30) Foreign Application Priority Data

Aug. 26, 2019 (KR) .................. 10-2019-0104585

(51) Int. Cl.
*H01L 25/065* (2023.01)
*H01L 23/00* (2006.01)
*H01L 23/29* (2006.01)

(52) U.S. Cl.
CPC ........ *H01L 25/0657* (2013.01); *H01L 23/293* (2013.01); *H01L 24/13* (2013.01); *H01L 2924/00* (2013.01)

(58) Field of Classification Search
CPC ... H01L 2224/0401; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235;
(Continued)

(56) References Cited

U.S. PATENT DOCUMENTS 8,115,319 B2   2/2012 Hsu et al.
8,288,871 B1 * 10/2012 Shieh ............... H01L 24/16
                                                              257/773
(Continued)

OTHER PUBLICATIONS

Jaber Derakhshandeh et al., "3D stacking using bump-less process for sub 10um pitch interconnects", 2016 IEEE 66th Electronic Components and Technology Conference, May 2016, 7 pages.

*Primary Examiner* — Victor A Mandala
*Assistant Examiner* — Lawrence C Tynes, Jr.
(74) *Attorney, Agent, or Firm* — Sughrue Mion, PLLC

(57) ABSTRACT

A semiconductor chip stack includes first and second semiconductor chips. The first chip includes a first semiconductor substrate having an active surface and an inactive surface, a first insulating layer formed on the inactive surface, and first pads formed in the first insulating layer. The second semiconductor chip includes a second semiconductor substrate having an active surface and an inactive surface, a second insulating layer formed on the active surface, second pads formed in the second insulating layer, a polymer layer formed on the second insulating layer, UBM patterns buried in the polymer layer; and buried solders formed on the UBM patterns, respectively, and buried in the polymer layer. A lower surface of the buried solders is coplanar with that of the polymer layer, the buried solders contact the first pads, respectively, at a contact surface, and a cross-sectional area of the buried solders is greatest on the contact surface.

15 Claims, 36 Drawing Sheets

(58) Field of Classification Search
CPC .............. H01L 2224/16155–16168; H01L 2224/16225–1624; H01L 2224/24155; H01L 2224/24225–24227; H01L 2224/32155–32168; H01L 2224/32225–3224; H01L 2224/40155–40165; H01L 2224/40225–4024; H01L 2224/13009; H01L 2224/13025; H01L 2224/16146; H01L 2224/73103–73104; H01L 2224/73153; H01L 2224/73203–73209; H01L 2224/73253–73261; H01L 2224/022–02215; H01L 2224/0391; H01L 2224/03916; H01L 2224/1148; H01L 2224/1191; H01L 2224/11916; H01L 2224/2748; H01L 2224/2791; H01L 2224/27916; H01L 25/043; H01L 25/0657; H01L 25/074; H01L 25/0756; H01L 25/117; H01L 2225/06503–06596; H01L 23/49827; H01L 23/5384; H01L 23/5329–53295; H01L 21/76801–76837
See application file for complete search history.

(56) References Cited

U.S. PATENT DOCUMENTS

| | | | |
|---|---|---|---|
| 9,245,834 B2 | 1/2016 | Hsieh | |
| 9,875,980 B2 | 1/2018 | Rinne et al. | |
| 10,224,299 B2 | 3/2019 | Oka et al. | |
| 2010/0244241 A1* | 9/2010 | Marimuthu | H01L 25/0657 257/737 |
| 2012/0049346 A1* | 3/2012 | Lin | H01L 24/13 257/737 |
| 2012/0292746 A1* | 11/2012 | Lee | H01L 21/76898 257/621 |
| 2013/0111123 A1* | 5/2013 | Thayer | G06F 13/385 711/105 |
| 2015/0001704 A1* | 1/2015 | Lu | H01L 24/13 257/737 |
| 2015/0061120 A1* | 3/2015 | Yang | H01L 25/0657 257/737 |
| 2016/0141273 A1* | 5/2016 | Tsuji | H01L 24/97 257/737 |
| 2016/0148891 A1* | 5/2016 | Tsao | H01L 24/16 257/737 |
| 2017/0162507 A1* | 6/2017 | Das | H01L 23/49838 |
| 2017/0365587 A1* | 12/2017 | Hung | H01L 21/565 |
| 2018/0033756 A1 | 2/2018 | Lee et al. | |
| 2018/0182724 A1 | 6/2018 | Chuang et al. | |
| 2018/0218971 A1 | 8/2018 | Lewandowski et al. | |
| 2018/0342434 A1* | 11/2018 | Ziglioli | H01L 21/4882 |
| 2019/0131260 A1 | 5/2019 | Kirby | |
| 2019/0164920 A1* | 5/2019 | Tsao | H01L 24/16 |
| 2019/0295988 A1* | 9/2019 | Tsukiyama | H01L 24/14 |
| 2020/0126917 A1* | 4/2020 | Kaeding | H01L 27/14618 |

* cited by examiner

SEMICONDUCTOR CHIP STACK STRUCTURE, SEMICONDUCTOR PACKAGE, AND METHOD OF MANUFACTURING THE SAME

CROSS-REFERENCE TO RELATED APPLICATION

This application claims priority from Korean Patent Application No. 10-2019-0104585, filed on Aug. 26, 2019, in the Korean Intellectual Property Office, the disclosure of which is incorporated by reference herein in its entirety.

BACKGROUND

1. Field

The present disclosure relates to a semiconductor package and a method of manufacturing the semiconductor package.

2. Description of Related Art

For the past several decades, due to development of technologies, materials, and manufacturing processes, computing power and a wireless communication technology have been rapidly developed. Therefore, a high performance transistor may be directly implemented and an integration speed has doubled about every 18 months in accordance with Moore's law. Making systems light, thin, short, and small devices and making power efficient devices are continuous targets of the semiconductor manufacturing industry. At the current point in time at which economic and physical limits are reached, three-dimensional integrated packaging is suggested as an effective solution method.

Development of a three dimensionally integrated device started from a complementary metal oxide semiconductor (CMOS) integrated device suggested in 1980 and has developed through continuous research and development (R&D) for 30 years. A three-dimensional (3D) integration technology may be, for example, integration of a logic circuit and a memory circuit, sensor packaging, or heterogeneous integration of microelectromechanical systems (MEMS) and CMOS. The 3D integration technology allows high reliability, low power consumption, and low manufacturing cost as well as reduction in form factor to be achieved.

Recently, due to solder for 3D bonding and downsizing of a pitch of the solder, as a technology for conjunction of a fine pitch region, a reflow process tends to be replaced by a thermo-compression bonding (TCB) process.

SUMMARY

It is an aspect to provide a semiconductor package having improved reliability and a method of manufacturing the same.

According to an aspect of one or more embodiments, there is provided semiconductor chip stack structure comprising a first semiconductor chip including a first semiconductor substrate having an active surface and a non-active surface opposite to the active surface; a first semiconductor device layer formed on the active surface and including a circuit pattern; a first rear surface insulating layer formed on the non-active surface; a plurality of first rear surface pads formed at a same level as the first rear surface insulating layer; a first front surface insulating layer formed on the first semiconductor device layer and spaced apart from the first semiconductor substrate with the first semiconductor device layer interposed therebetween; a plurality of first front surface pads formed at a same level as the first front surface insulating layer; a plurality of first through electrodes configured to pass through the first semiconductor substrate and the first semiconductor device layer and to be electrically connected to the plurality of first rear surface pads, respectively, and the plurality of first front surface pads, respectively; a first polymer layer formed on the first front surface insulating layer; a plurality of first under bump metallurgy (UBM) patterns buried in the first polymer layer; and a plurality of first buried solders formed on the plurality of first UBM patterns, respectively, and buried in the first polymer layer; and a second semiconductor chip including a second semiconductor substrate having an active surface and a non-active surface opposite to the active surface; a second semiconductor device layer formed on the active surface of the second semiconductor substrate and including a circuit pattern; a second front surface insulating layer formed on the second semiconductor device layer and spaced apart from the second semiconductor substrate with the second semiconductor device layer interposed therebetween; a plurality of second front surface pads formed at a same level as the second front surface insulating layer; a second polymer layer formed on the second front surface insulating layer; a plurality of second UBM patterns buried in the second polymer layer; and a plurality of second buried solders formed on the plurality of second UBM patterns, respectively, and buried in the second polymer layer, and wherein a lower surface of the plurality of second buried solders is coplanar with a lower surface of the second polymer layer, the plurality of second buried solders contact the plurality of first rear surface pads, respectively, at a contact surface, and a horizontal cross-sectional area of each of the plurality of second buried solders is greatest on the contact surface.

According to another aspect of one or more embodiments, there is provided a semiconductor package including a first semiconductor chip, a second semiconductor chip, and a third semiconductor chip, which are sequentially stacked, wherein the first semiconductor chip is different from the second semiconductor chip and from the third semiconductor chip, wherein the second semiconductor chip comprises a second semiconductor substrate; a semiconductor device layer formed on an active surface of the second semiconductor substrate and including a circuit pattern; a front surface insulating layer formed on the semiconductor device layer and spaced apart from the semiconductor substrate with the semiconductor device layer interposed therebetween; a plurality of front surface pads formed at a same level as the front surface insulating layer; a polymer layer formed on the front surface insulating layer; a plurality of under bump metallurgy (UBM) patterns buried in the polymer layer; and a plurality of buried solders contacting the plurality of UBM patterns, respectively, and buried in the polymer layer, and wherein a lower surface of the plurality of buried solders is coplanar with a lower surface of the polymer layer and a horizontal cross-sectional area of each of the plurality of buried solders increases as a distance from the first semiconductor chip decreases.

According to yet another aspect of one or more embodiments, there is provided a semiconductor package comprising a package substrate; a semiconductor chip stack including a first semiconductor chip and a second semiconductor chip stacked on the package substrate; and a logic chip spaced apart from the semiconductor chip stack on the package substrate, wherein the first semiconductor chip comprises a first semiconductor substrate; a first semiconductor device layer formed on the first semiconductor substrate and including a circuit pattern; a plurality of first through electrodes configured to pass through the first semiconductor substrate and the first semiconductor device layer in a first direction perpendicular to an upper surface of a semiconductor substrate; a first polymer layer formed on the first semiconductor device layer; a plurality of first under bump metallurgy (UBM) patterns configured to be buried in the first polymer layer and to be electrically connected to the plurality of first through electrodes, respectively; and a plurality of first buried solders arranged on the plurality of first UBM patterns and buried in the first polymer layer, wherein a horizontal cross-sectional area of each of the plurality of first buried solders buried in the first polymer layer increases as a distance from the package substrate decreases.

According to yet another aspect of one or more embodiments, there is provided a method of manufacturing a semiconductor package, the method comprising providing a first wafer including a first semiconductor device layer, a first insulating layer arranged on the first semiconductor device layer, and first pads arranged at a same level as the first insulating layer; forming a first polymer layer on the first wafer; forming first openings to expose the first pads; forming first under bump metallurgy (UBM) patterns in the first openings; forming side wall inclinations at a portion of side walls of the first openings by etching the first polymer layer by plasma; and forming first buried solders to fill the first openings.

According to yet another aspect of one or more embodiments, there is provided a semiconductor chip stack structure comprising a first semiconductor chip comprising a first semiconductor substrate having an active surface and an inactive surface; a first insulating layer formed on the inactive surface; a plurality of first pads formed in the first insulating layer; and a second semiconductor chip comprising a second semiconductor substrate having an active surface and an inactive surface; a second insulating layer formed on the active surface; a plurality of second pads formed in the second insulating layer; a polymer layer formed on the second insulating layer; a plurality of UBM patterns buried in the polymer layer; and a plurality of buried solders formed on the plurality of UBM patterns, respectively, and buried in the polymer layer, and wherein a lower surface of the plurality of buried solders is coplanar with a lower surface of the polymer layer, the plurality of buried solders contact the plurality of first pads, respectively, at a contact surface, and a horizontal cross-sectional area of each of the plurality of buried solders is greatest on the contact surface.

BRIEF DESCRIPTION OF THE DRAWINGS

Various embodiments will be more clearly understood from the following detailed description taken in conjunction with the accompanying drawings in which.

DETAILED DESCRIPTION

Hereinafter, various embodiments will be described in detail with reference to the accompanying drawings. In this specification, the phrase "at least one of A, B or C" includes within its scope "only A", "only B", "only C", "both A and B", "both A and C", "both B and C" or "all of A, B, and C".

Figure 1A:
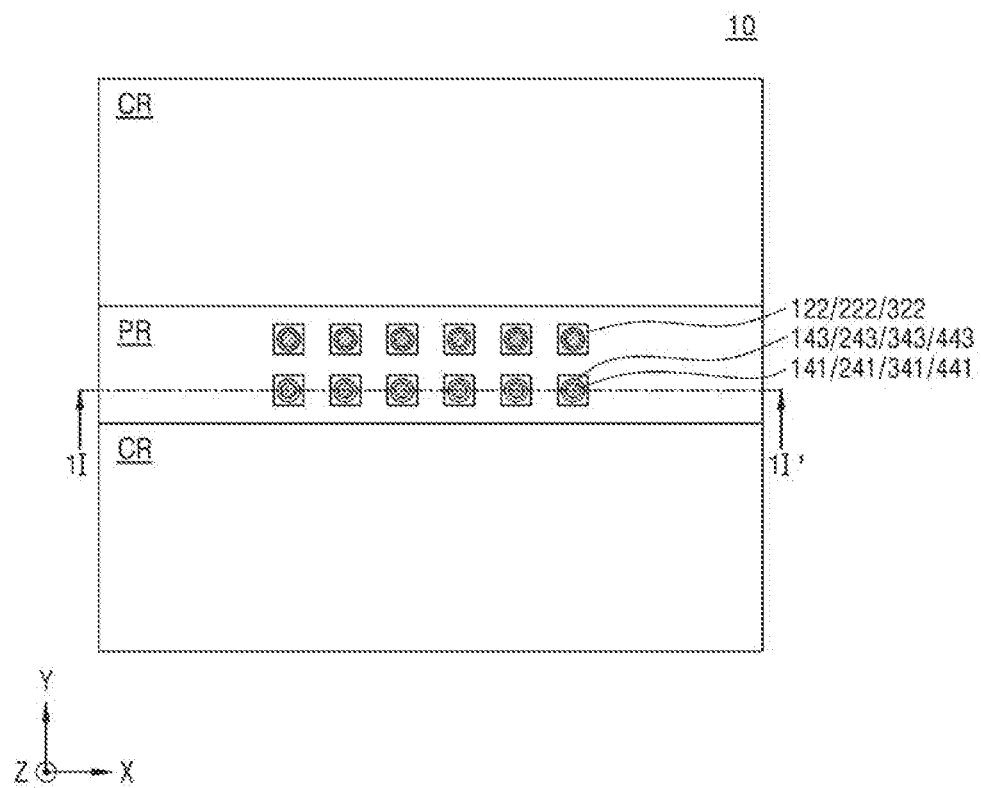
FIG. 1A is a layout diagram illustrating a semiconductor package according to various embodiments.
Figure 1B:
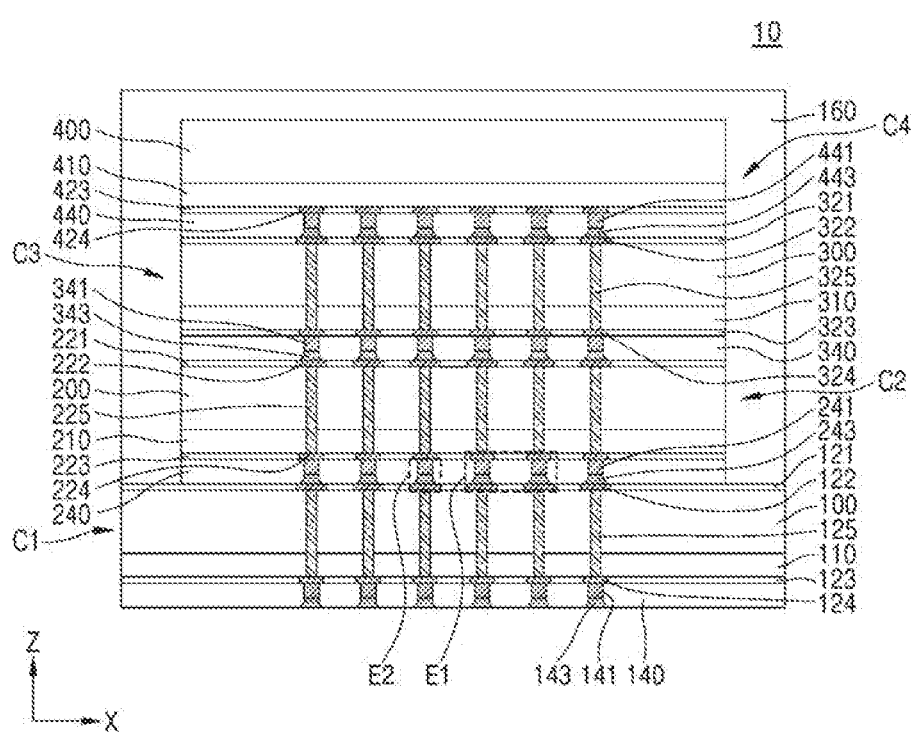
FIG. 1B is a cross-sectional view taken along the line 1I-1I' of FIG. 1A.

FIG. 1A is a layout diagram illustrating a semiconductor chip stack structure 10 according to various embodiments. FIG. 1B is a cross-sectional view taken along the line 1I-1I' of FIG. 1A.

In the layout of FIG. 1A, for convenience sake, only first rear surface pads 122, second rear surface pads 222, and third rear surface pads 322, first under bump metallurgy (UBM) patterns 141, second UBM patterns 241, third UBM patterns 341, and fourth UBM patterns 441, and first buried solders 143, second buried solders 243, third buried solders 343, and fourth buried solders 443 are illustrated. As described later, the first to third rear surface pads 122, 222, and 322, the first to fourth UBM patterns 141, 241, 341, and 441, and the first to fourth buried solders 143, 243, 343, and 443 are aligned and may overlap in a vertical direction, that is, in a Z direction. Here, being "aligned" means being aligned within a range of a certain tolerance.

Referring to FIGS. 1A and 1B, the semiconductor chip stack structure 10 may include a first semiconductor chip C1, a second semiconductor chip C2, a third semiconductor chip C3, and a fourth semiconductor chip C4 that are stacked in a first direction (or in the vertical direction or the Z direction of FIG. 1B), and a molding layer 160.

The semiconductor chip stack structure 10 may include a circuit region CR in which a circuit is formed and a pad region PR for electrical connection among the stacked first to fourth semiconductor chips C1, C2, C3, and C4. In FIG. 1A, two circuit regions CR are illustrated as being spaced apart from each other with a pad region interposed therebetween. However, these illustrations are for illustrative purposes and do not limit the technical spirit of the present disclosure in any sense.

In the pad region PR, first through electrodes 125, second through electrodes 225, and third through electrodes 325, the first to fourth UBM patterns 141, 241, 341, and 441, and the first to fourth buried solders 143, 243, 343, and 443 may be formed. In FIG. A, a schematic configuration of a lower surface of the semiconductor chip stack structure 10, that is, a lower surface of the first semiconductor chip C1, to which the first UBM patterns 141 and the first buried solders 143 are exposed, is exemplarily illustrated.

The first to third through electrodes 125, 225, and 325, the first to fourth UBM patterns 141, 241, 341, and 441, and the first to fourth buried solders 143, 243, 343, and 443 may be arranged in the pad region PR in X and Y directions in various layouts. In some embodiments, as illustrated in FIG. A, in the pad region PR, the first to third through electrodes 125, 225, and 325, the first to fourth UBM patterns 141, 241, 341, and 441, and the first to fourth buried solders 143, 243, 343, and 443 may form a matrix in the X and Y directions with a prescribed pitch. Referring to FIG. TA, when viewed from above, the first UBM patterns 141 are illustrated as being substantially circular, but are not limited thereto. For example, in some embodiments, the planes of the first UBM patterns 141 may be approximately square. That is, the shape of the first UBM patterns 141 may be, for example, approximately square. Alternatively, in other embodiments, the shape of the first UBM patterns 141 may have other geometric shapes.

In addition, for convenience sake, in FIG. TA, it is exemplarily illustrated that, in the pad region PR, six first UBM patterns 141 are arranged in the X direction and two first UBM patterns 141 are arranged in the Y direction. However, the number and arrangement of first UBM patterns 141 are not limited to those illustrated in FIG. TA.

The first to fourth semiconductor chips C, C2, C3, and C4 may be, for example, memory semiconductor chips. Here, the memory semiconductor chip may be, for example, a volatile memory semiconductor chip such as dynamic random access memory (DRAM) or static random access memory (SRAM) or a non-volatile memory semiconductor chip such as phase-change random access memory (PRAM), magnetoresistive random access memory (MRAM), ferroelectric random access memory (FeRAM), or resistive random access memory (ReRAM). In some embodiments, the first to fourth semiconductor chips C1, C2, C3, and C4 may be DRAM semiconductor chips for configuring high bandwidth memory (HBM).

In FIGS. 1A and 1B, the semiconductor chip stack structure 10 in which the first to fourth semiconductor chips C1, C2, C3, and C4 are stacked is exemplarily illustrated. However, the number of semiconductor chips stacked in the semiconductor chip stack structure 10 is not limited thereto. For example, in some embodiments, 2 to 32 semiconductor chips may be stacked in the semiconductor chip stack structure 10.

The first UBM patterns 141 and the first buried solders 143 may be arranged on the lower surface of the first semiconductor chip C1. The second semiconductor chip C2 may be mounted on an upper surface of the first semiconductor chip C1. Between the first and second semiconductor chips C1 and C2, the second UBM patterns 241 and the second buried solders 243 are interposed and accordingly, the second semiconductor chip C2 may be electrically connected to the first semiconductor chip C1. The third semiconductor chip C3 may be mounted on the second semiconductor chip C2. The third UBM patterns 341 and the third buried solders 343 are interposed between the second and third semiconductor chips C2 and C3 and accordingly, the third semiconductor chip C3 may be electrically connected to the second semiconductor chip C2. In addition, the fourth semiconductor chip C4 may be mounted on the third semiconductor chip C3. The fourth UBM patterns 441 and the fourth buried solders 443 are interposed between the third and fourth semiconductor chips C3 and C4 and accordingly, the fourth semiconductor chip C4 may be electrically connected to the third semiconductor chip C3.

The first semiconductor chip C1 may include a first semiconductor substrate 100, a first semiconductor device layer 110, first through electrodes 125, a first rear surface insulating layer 121, first rear surface pads 122, a first front surface insulating layer 123, first front surface pads 124, a first polymer layer 140, the first UBM patterns 141, and the first buried solders 143. The first semiconductor substrate 100 may include an active surface and a non-active surface that are opposite to each other. The first semiconductor device layer 110 may be formed on the active surface of the first semiconductor substrate 100. The first through electrodes 125 may pass through the first semiconductor substrate 100 and the first semiconductor device layer 110 in the Z direction. The first rear surface insulating layer 121 and the first rear surface pads 122 may be formed on the non-active surface of the first semiconductor substrate 100. The first rear surface pads 122 may be electrically connected to the first through electrodes 125. The first front surface insulating layer 123 and the first front surface pads 124 may be formed on the first semiconductor device layer 110. Therefore, the first front surface insulating layer 123 may be apart from the first semiconductor substrate 100 with the first semiconductor device layer 110 interposed therebetween.

The first front surface insulating layer 123 and the first rear surface insulating layer 121 may include protective layers for protecting the first semiconductor device layer 110 and a wiring structure formed in the first semiconductor device layer 110 against external shock or moisture. For example, the first front surface insulating layer 123 and the first rear surface insulating layer 121 may include an inorganic insulating layer or an organic insulating layer. According to some embodiments, the first front surface insulating layer 123 and the first rear surface insulating layer 121 may include at least one of a silicon nitride, a silicon oxide, or a silicon oxynitride.

The first polymer layer 140 may be formed on the first front surface insulating layer 123. The first polymer layer 140 may include an insulating polymer. According to some embodiments, the first polymer layer 140 may be formed by a process other than an underfilling process. According to some embodiments, the first polymer layer 140 may omit an epoxy mold compound (EMC). According to some embodiments, the first polymer layer 140 may omit a reactive prepolymer and a polymer that contain an epoxide group. According to some embodiments, the first polymer layer 140 may omit a bisphenol-based epoxy resin, a novolac epoxy resin, an aliphatic epoxy resin, a halide epoxy resin, an epoxy resin diluent, and a glycidyl amine epoxy resin.

The first UBM patterns 141 and the first buried solders 143 may be arranged in the first polymer layer 140. The first UBM patterns 141 and the first buried solders 143 may form a stack structure. Side surfaces of the first UBM patterns 141 and the first buried solders 143 may be covered with the first polymer layer 140. The first buried solders 143 may be embedded in the first polymer layer 140. Upper surfaces of the first buried solders 143 may be coplanar with an upper surface of the first polymer layer 140 and may be exposed to the outside. Thus, the first buried solders 143 may be buried in the first polymer layer 140.

The first semiconductor substrate 100 may include, for example, silicon (Si). Alternatively, the first semiconductor substrate 100 may include a semiconductor element such as germanium (Ge) or a compound semiconductor such as silicon carbide (SiC), gallium arsenic (GaAs), indium arsenic (InAs), or indium phosphide (InP). Alternatively, the first semiconductor substrate 100 may have a silicon on insulator (SOI) structure. For example, the first semiconductor substrate 100 may include a buried oxide (BOX) layer. The first semiconductor substrate 100 may include a conductive region, for example, a well doped with impurities or a structure doped with impurities. In addition, the first semiconductor substrate 100 may have various device isolation structures such as a shallow trench isolation (STI) structure.

The first semiconductor device layer 110 may include various kinds of a plurality of individual devices and an interlayer insulating layer. The plurality of individual devices may include various microelectronic devices, for example, a metal-oxide-semiconductor field effect transistor (MOSFET) such as a complementary metal-insulator-semiconductor (CMOS) transistor, system large scale integration (LSI), flash memory, dynamic random access memory (DRAM), static RAM (SRAM), electrically erasable programmable read-only memory (EEPROM), programmable RAM (PRAM), magnetic RAM (MRAM), or resistive RAM (ReRAM), an image sensor such as a CMOS imaging sensor (CIS), a micro-electro-mechanical system (MEMS), an active device, and/or a passive device. The plurality of individual devices may be formed in the first semiconductor device layer 110 in a cell region CR and may be electrically connected to the conductive region of the first semiconductor substrate 100. The first semiconductor device layer 110 may further include at least two of the plurality of individual devices or a conductive wiring line or a conductive plug for electrically connecting the plurality of individual devices to the conductive region of the first semiconductor substrate 100. In addition, the plurality of individual devices may be electrically separated from other adjacent individual devices by insulating layers.

The first semiconductor device layer 110 may include a plurality of wiring structures for connecting the plurality of individual devices to other wiring lines formed on the first semiconductor substrate 100. The plurality of wiring structures may include a metal wiring pattern that extends in a horizontal direction and a via plug that extends in a vertical direction. The metal wiring pattern and the via plug may include a barrier layer and a conductive layer. The wiring barrier layer may include at least one material of titanium (Ti), titanium nitride (TiN), tantalum (Ta), or tantalum nitride (TaN). The conductive layer may include at least one metal of tungsten (W), aluminum (Al), or copper (Cu). The plurality of wiring structures may be multilayer structures in which two or more metal wiring patterns and two or more via plugs are alternately stacked. According to some embodiments, the first front surface pads 124 and the first rear surface pads 122 may also include at least one metal of W, Al, or Cu.

The first through electrodes 125 may pass through the first semiconductor substrate 100 and the first semiconductor device layer 110. The first through electrodes 125 may be pillar-shaped. The first through electrodes 125 may include a barrier layer that defines surfaces of the pillars and a buried conductive layer that fills an inside of the barrier layer. The barrier layer may include at least one of Ti, TiN, and Ta, or TaN, rubidium (Ru), cobalt (Co), manganese (Mn), tungsten nitride (WN), nickel (Ni), or nickel boride (NiB). The buried conductive layer may include at least one of Cu alloys such as Cu, CuSn, CuMg, CuNi, CuZn, CuPd, CuAu, CuRe, or CuW, W, an W alloy, Ni, Ru, or Co. In some embodiments, the first through electrodes 125 may be formed at the same level as the first semiconductor substrate 100 and the first semiconductor device layer 110, and may further include a through via insulating layer that covers the barrier layer. The through via insulating layer may include an oxide layer, a nitride layer, a carbide layer, a polymer, or a combination of these layers.

The first UBM patterns 141 may be arranged on the first semiconductor device layer 110 and may contact the first front surface pads 124. The first UBM patterns 141 may include at least one of tin (Sn), Ti, vanadium (V), antimony (Sb), lead (Pb), W, chrome (Cr), Cu, Ni, Al, palladium (Pd), silver (Ag), or gold (Au).

The first UBM patterns 141 may be a single metal layer or may have a stack structure of a plurality of metal layers. For example, the first UBM patterns 141 may include a first metal layer, a second metal layer, and a third metal layer that are sequentially stacked. The first metal layer may include a material having high adhesiveness to the first front surface pads 124 and the first front surface insulating layer 123. That is, the first metal layer may include an adhesive layer for improving stability in forming the first buried solders 143. For example, the first metal layer may include at least one of Ti, Ti—W, Cr, or Al. The second metal layer may include a barrier layer for preventing a metal material included in the first buried solders 143 from diffusing into the first semiconductor substrate 100. The second metal layer may include at least one of Cu, Ni, Cr—Cu, or Ni—V. The third metal layer may function as a seed layer for forming the first buried solders 143 or a wetting layer for improving a wetting characteristic of the first buried solders 143. The third metal layer may include at least one of Ni, Cu, or Al.

The first buried solders 143 may be arranged on the first UBM patterns 141. The first buried solders 143 may form the lowermost surface of the semiconductor chip stack structure 10 together with the first polymer layer 140. According to some embodiments, the first buried solders 143 may be chip-substrate connection solders for mounting the semiconductor chip stack structure 10 on an external substrate or an interposer. According to some embodiments, the first buried solders 143 may be chip-chip connection solders for mounting the semiconductor chip stack structure 10 on an external surface or an interposer.

The first buried solders 143 may configure a path for receiving at least one of a control signal for operating the first to fourth semiconductor chips C, C2, C3, and C4, a power supply potential, or a ground potential from the outside, receiving a data signal to be stored in the first to fourth semiconductor chips C1, C2, C3, and C4 from the outside, and/or providing data stored in the first to fourth semiconductor chips C, C2, C3, and C4 to the outside.

The first buried solders 143 may include a solder material. The first buried solders 143 may include Sn, In, bismuth (Bi), Sb, Cu, Ag, zinc (Zn), Pb and/or an alloy of these metals. For example, the first buried solders 143 may include at least one of Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn.

In some embodiments, an intermediate layer may be formed on a contact interface between the first buried solders 143 and the first UBM patterns 141. The intermediate layer may include an intermetallic compound (IMC) formed by metal materials included in the first buried solders 143 and the first UBM patterns 141 reacting at a high temperature. For example, when the first UBM patterns 141 include Cu and/or Ni and the first buried solders 143 include Sn and/or Cu, the intermediate layer may include at least one of $(Cu,Ni)_6Sn_5$, $(Cu,Ni)_3Sn_4$, or $(Cu,Ni)_3Sn$. However, a material or composition of the intermediate layer is not limited thereto and may vary in accordance with a material, a soldering process time, and/or a temperature of the first buried solders 143 and the first UBM patterns 141.

The second semiconductor chip C2 may be mounted on the upper surface of the first semiconductor chip C1 and may be electrically connected to the first semiconductor chip C1 with the second buried solders 243 between the first semiconductor chip C1 and the second semiconductor chip C2.

The second semiconductor chip C2 may include a second semiconductor substrate 200, a second semiconductor device layer 210, a second rear surface insulating layer 221, the second rear surface pads 222, a second front surface insulating layer 223, second front surface pads 224, the second through electrodes 225, a second polymer layer 240, the second UBM patterns 241, and the second buried solders 243. The second buried solders 243 may contact the first rear surface pads 122 at a contact surface. According to some embodiments, the second semiconductor chip C2 may be the same as the first semiconductor chip C. Since the second semiconductor chip C2 has a technical feature similar to that of the first semiconductor chip C1, detailed description of the second semiconductor chip C2 will not be given for conciseness.

The third semiconductor chip C3 may include a third semiconductor substrate 300, a third semiconductor device layer 310, a third rear surface insulating layer 321, the third rear surface pads 322, a third front surface insulating layer 323, third front surface pads 324, the third through electrodes 325, a third polymer layer 340, the third UBM patterns 341, and the third buried solders 343. According to some embodiments, since the third semiconductor chip C3 has a technical feature similar to that of the first semiconductor chip C1, additional description of the third semiconductor chip C3 will not be given for conciseness.

The fourth semiconductor chip C4 may include a fourth semiconductor substrate 400, a fourth semiconductor device layer 410, a fourth front surface insulating layer 423, fourth front surface pads 424, a fourth polymer layer 440, the fourth UBM patterns 441, and the fourth buried solders 443. Since the fourth semiconductor chip C4 is a memory chip on the uppermost layer of stacked memory chips in the example shown in FIGS. 1A-1B, the rear surface insulating layer, the rear surface pads, and the through electrodes may be omitted. Excluding that the rear surface insulating layer, the rear surface pads, and the through electrodes are omitted, since the fourth semiconductor chip C4 has a technical feature similar to that of the first semiconductor chip C1, additional description of the fourth semiconductor chip C4 will be omitted for conciseness.

The third buried solders 343 may be interposed between the third UBM patterns 341 and the second rear surface pads 222. The third buried solders 343 may contact the third UBM patterns 341 and the second rear surface pads 222. Therefore, the second semiconductor chip C2 and the third semiconductor chip C3 may be electrically connected to each other. The fourth buried solders 443 may be interposed between the fourth UBM patterns 441 and the third rear surface pads 322. The fourth buried solders 443 may contact the fourth UBM patterns 441 and the third rear surface pads 322. Therefore, the third semiconductor chip C3 and the fourth semiconductor chip C4 may be electrically connected to each other.

The molding layer 160 may surround side surfaces of the second to fourth polymer layers 240, 340, and 440 and side surfaces of the second to fourth semiconductor chips C2, C3, and C4. The molding layer 160 may include, for example, an EMC. As illustrated in FIG. 1B, a width of the first semiconductor chip C1 in the horizontal direction (the X direction) may be greater than widths of the second to fourth semiconductor chips C2, C3, and C4 in the horizontal direction and the molding layer 160 may contact an edge of the upper surface of the first semiconductor chip C1. However, the inventive concept is not limited thereto. According to some embodiments, the molding layer 160 may cover an upper surface of the fourth semiconductor chip C4. In other embodiments, unlike in FIG. 1B, the molding layer 160 is not formed on the upper surface of the fourth semiconductor chip C4 and the upper surface of the fourth semiconductor chip C4 may be exposed to the outside of the semiconductor chip stack structure 10.

Figure 1C:
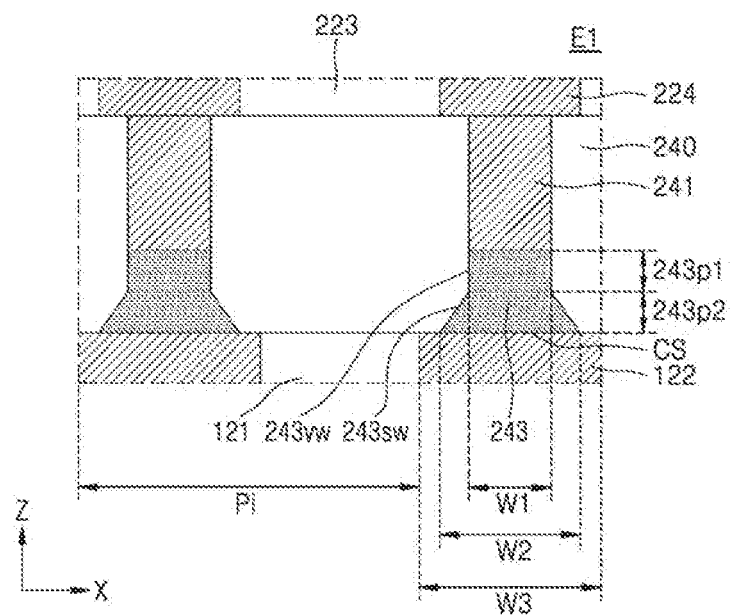
FIG. 1C is a partial cross-sectional view illustrating an enlargement of the region E1 of FIG. 1B.

FIG. 1C is a partial cross-sectional view illustrating an enlargement of the region E1 of FIG. 1B.

Referring to FIG. 1C, structural characteristics of the second buried solders 243 and the second UBM patterns 241 will be described in more detail. The first, third, and fourth buried solders 143, 343, and 443 and the first, third, and fourth UBM patterns 141, 341, and 441 may be the same as described hereinafter with reference to the second buried solders 243 and the second UBM patterns 241. Accordingly, a detailed description of the first, third, and fourth buried solders 143, 343, and 443 and the first, third, and fourth UBM patterns 141, 341, and 441 is omitted for conciseness.

Referring to FIG. 1C, the second buried solders 243 and the second UBM patterns 241 may have rotational symmetry with respect to an axis that runs parallel in the Z direction. However, the inventive concept is not limited thereto. The second buried solders 243 and the second UBM patterns 241 may have approximately square horizontal cross-sections.

The second UBM patterns 241 may be approximately columnar. Horizontal cross-sectional areas of the second UBM patterns 241 in the Z direction may be constant. Here, the horizontal cross-sectional areas mean cross-sectional areas perpendicular to the Z direction (that is, of which normal lines run parallel with the Z direction). The second buried solders 243 may include first portions 243p having constant horizontal cross-sectional areas and second portions 243p2 having changing horizontal cross-sectional areas. The first portions 243p1 of the second buried solders 243 may be approximately columnar or truncated cone-shaped.

The first portions 243p1 may include vertical side walls 243vw, and the second portions 243p2 may include inclined side walls 243sw. In some embodiments, heights (that is, lengths in the Z direction) of the first portions 243p and the second portions 243p2 may be equal to each other. However, the inventive concept is not limited thereto. For example, in some embodiments, the heights of the first portions 243p1 may be greater or less than those of the second portions 243p2.

The second portions 243p2 may contact the first rear surface pads 122 at a contact surface CS. The second portions 243p2 may have greater horizontal cross-sections toward the first rear surface pads 122. That is, the horizontal cross-sections of the second portions 243p2 may increase as a distance from the first rear surface pads 122 decreases, and the horizontal cross-section may be greatest at the contact surface between the second portions 243p2 and the first rear surface pads 122. Cross-section profiles of the inclined side walls 243sw may be linear. Angles of the inclined side walls 243sw in the horizontal direction may be constant. Therefore, changes in the horizontal cross-sectional areas of the second portions 243p2 in the Z direction may be constant.

According to some embodiments, a pitch Pi, that is, a repeating unit length of the second buried solders 243, the second UBM patterns 241, the second front surface pads 224, and the first rear surface pads 122 may be about 20 µm to about 1 µm. In other embodiments, the pitch Pi may be about 15 µm to about 2 µm. In other embodiments, the pitch Pi may be about 10 µm to about 3 µm.

According to some embodiments, a first width W1 (or a diameter) of each of the first portions 243p1 of the second buried solders 243 and the second UBM patterns 241 may be about 10 µm to about 0.3 µm. In other embodiments, the first width W1 may be about 5 µm to about 0.6 µm. In other embodiments, the first width W1 may be about 3 µm to about 1 µm.

According to some embodiments, a second width W2 that is a maximum width of each of the second portions 243p2 of the second buried solders 243 may be a horizontal width of each of portions that contact the first rear surface pads 122. According to some embodiments, the second width W2 may be less than a third width W3 and may be equal to or greater than the first width W1. According to some embodiments, the second width W2 may be about 15 µm to about 0.3 µm. In other embodiments, the second width W2 may be about 10 µm to about 0.6 µm. In other embodiments, the second width W2 may be about 2 µm to about 1 µm.

According to some embodiments, the third width W3 that is a width of the corresponding first rear surface pad 122 may be about 15 µm to about 0.5 µm. In other embodiments, the third width W3 may be about 10 µm to about 1 µm. In other embodiments, the third width W3 may be about 5 µm to about 2 µm.

According to some embodiments, as described later, since the horizontal cross-sectional areas of the second buried solders 243 increase as a distance from the first rear surface pads 122 decreases, a horizontal cross-sectional area (or a horizontal width) of the second polymer layer 240 may be decreased as a distance from the corresponding first rear surface pad 122 decreases.

Recently, as a pitch of a semiconductor device is becoming more fine, a solder bump having a pitch of no more than about 20 µm is being required.

In structures of the buried solders, since the polymer layers surround the buried solders, in a thermo-compressing process described later, due to mismatch between under-layers (for example, the rear surface insulating layers and the rear surface pads) and a coefficient of thermal expansion (CTE), the buried solders are distorted or slide. Therefore, the buried solders move in parallel. In this case, circuit defects may occur due to openings between under-patterns and buried patterns.

According to various embodiments disclosed herein, the second to fourth buried solders 243, 343, and 443 may have increased (or maximum) cross-sectional areas on surfaces that meet the first to third rear surface pads 122, 222, and 322, respectively. Therefore, even when the second to fourth buried solders 243, 343, and 443 and the first to third rear surface pads 122, 222, and 322, respectively, are misaligned due to the CTE mismatch, circuit defects caused by the openings may be prevented.

Furthermore, a cross-sectional area (or a width) on the surfaces in which the second to fourth buried solders 243, 343, and 443 meet the first to third rear surface pads 122, 222, and 322, respectively, may be less than a cross-sectional area (or a width) of the first to third rear surface pads 122, 222, and 322. That is, W2 may be less than W3. Therefore, even when the second to fourth buried solders 243, 343, and 443 and the first to third rear surface pads 122, 222, and 322, respectively, are misaligned due to the CTE mismatch, circuit defects caused by a short may be prevented.

Figure 1D:
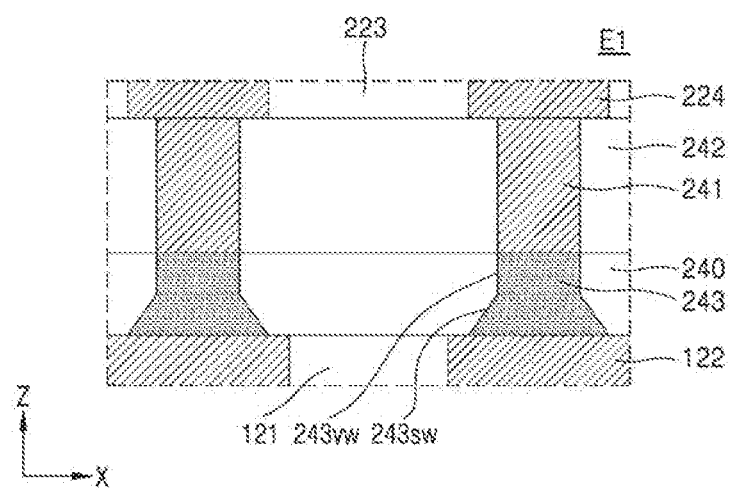
FIG. 1D is a view illustrating a semiconductor package according to some other embodiments.

FIG. 1D is a view illustrating a semiconductor package according to some other embodiments.

In more detail, FIG. 1D is a partial cross-sectional view corresponding to FIG. 1C and, for convenience sake, description previously given with reference to FIGS. 1A to 1C is omitted for conciseness and description will be mainly given to a difference between FIGS. 1A to 1C and FIG. 1D.

Referring to FIG. 1D, a second insulating layer 242 may be interposed between the second front surface insulating layer 223 and the second polymer layer 240. That is, the semiconductor chip stack structure corresponding to FIG. 1D is the same as the semiconductor chip stack structure 10 described with reference to FIGS. 1A to 1C and each semiconductor chip may further include an insulating layer interposed between a front surface insulating layer and a polymer layer.

The second insulating layer 242 may include an insulating material. According to some embodiments, the second insulating layer 242 may include a polymer different from that included in the second polymer layer 240. According to some embodiments, the second insulating layer 242 may include a silicon oxide, a silicon nitride, and/or a silicon oxynitride.

The second insulating layer 242 may be arranged at the same level as that of the second UBM patterns 241. According to some embodiments, the second UBM patterns 241 may be formed by a damascene process of patterning the second insulating layer 242, accumulating a UBM pattern material, and planarizing the material. However, the inventive concept is not limited thereto. The second UBM patterns 241 may be formed by an electroplating process after patterning the second insulating layer 242.

Figure 2A:
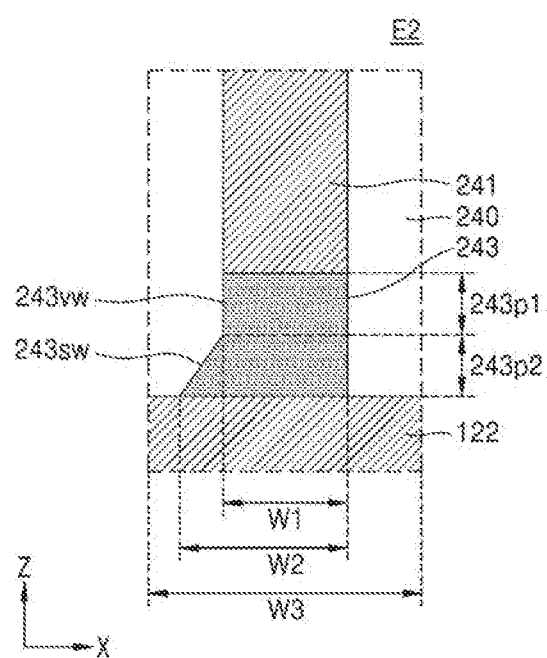
FIGS. 2A to 2Q are partial cross-sectional views illustrating a semiconductor package according to different embodiments.
Figure 2B:
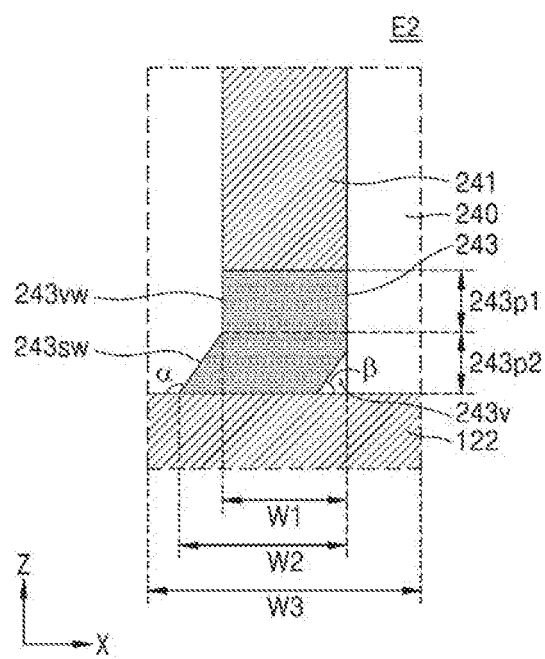
Figure 2C:
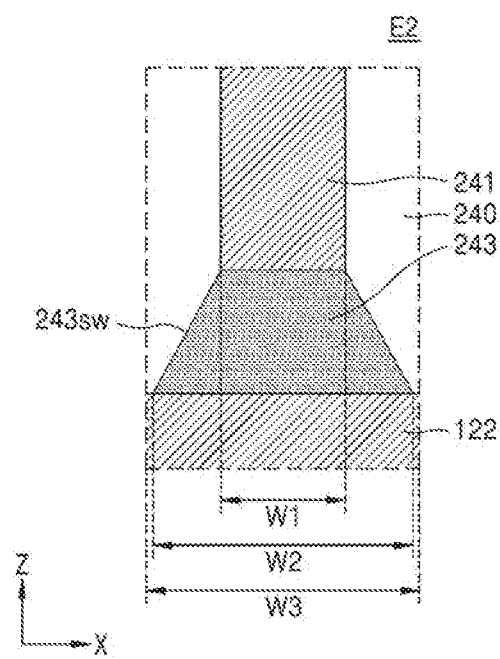
Figure 2D:
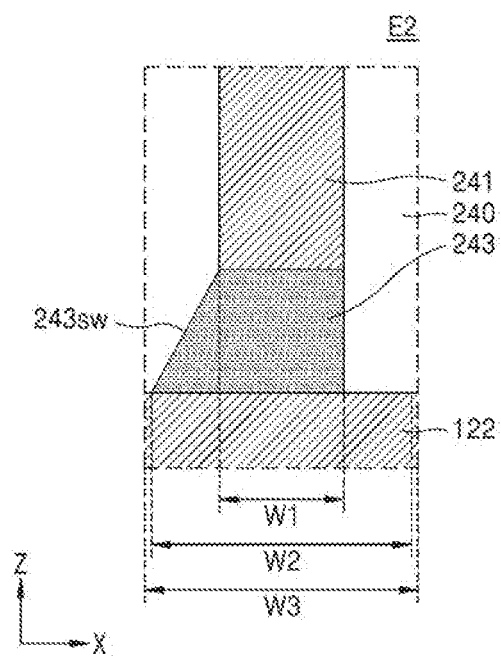
Figure 2E:
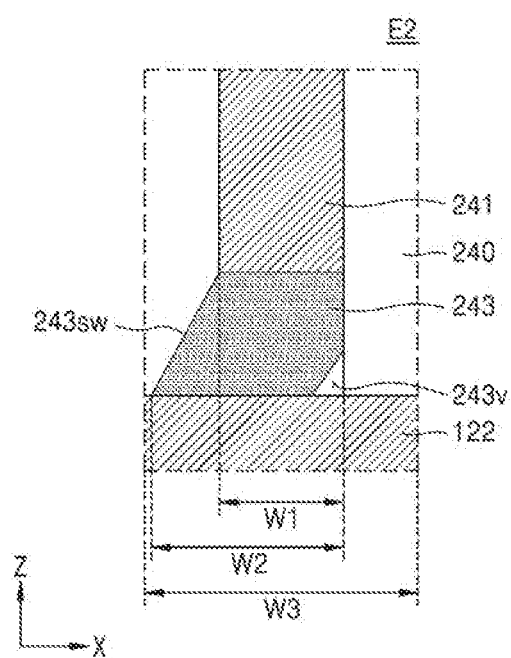
Figure 2F:
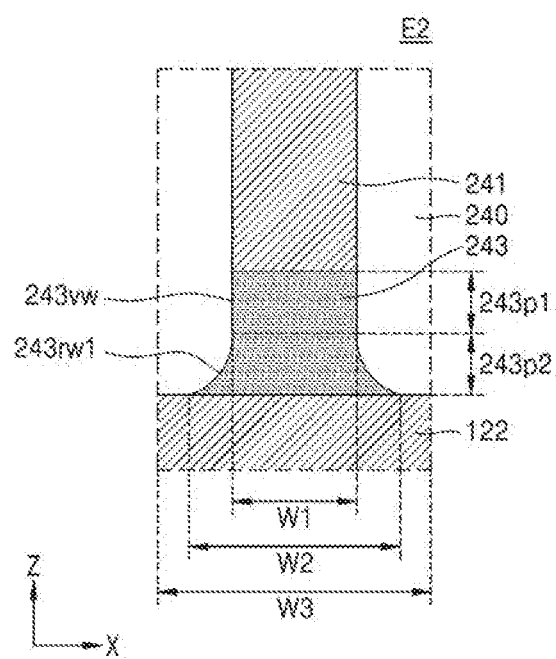
Figure 2G:
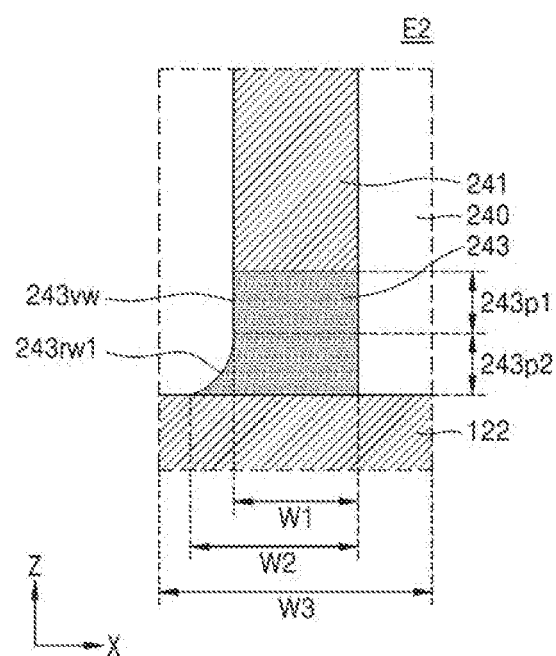
Figure 2H:
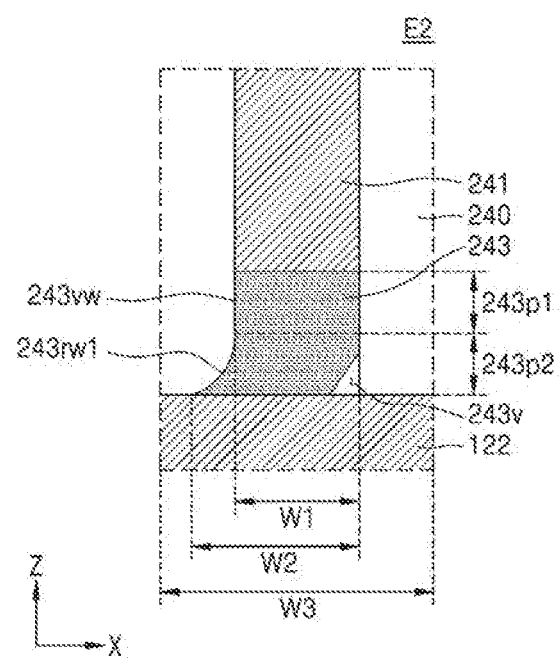
Figure 21:
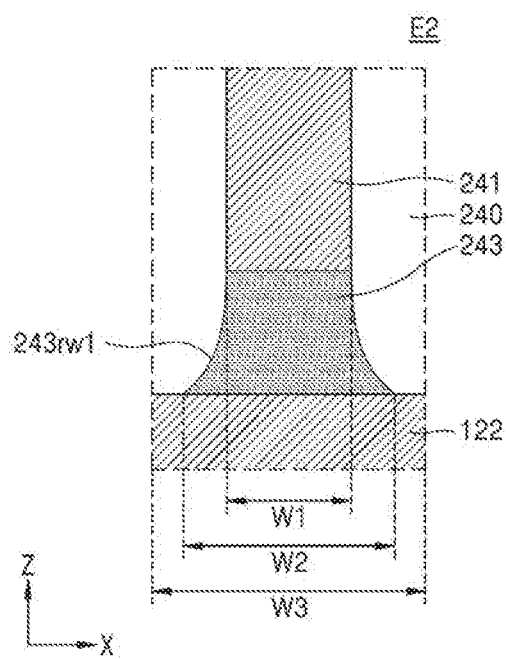
Figure 2J:
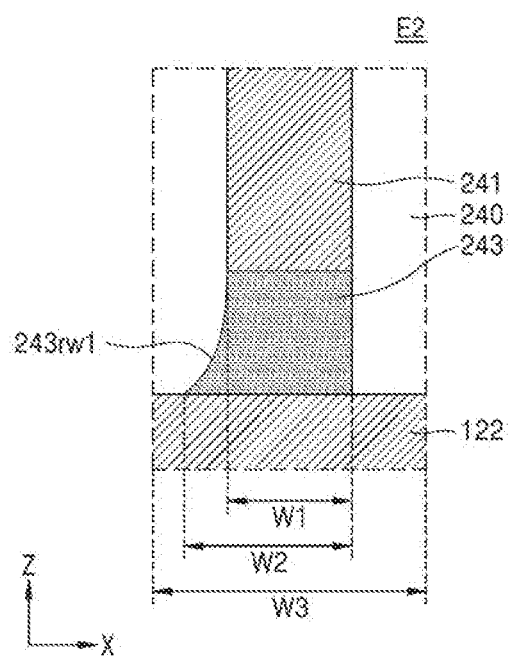
Figure 2K:
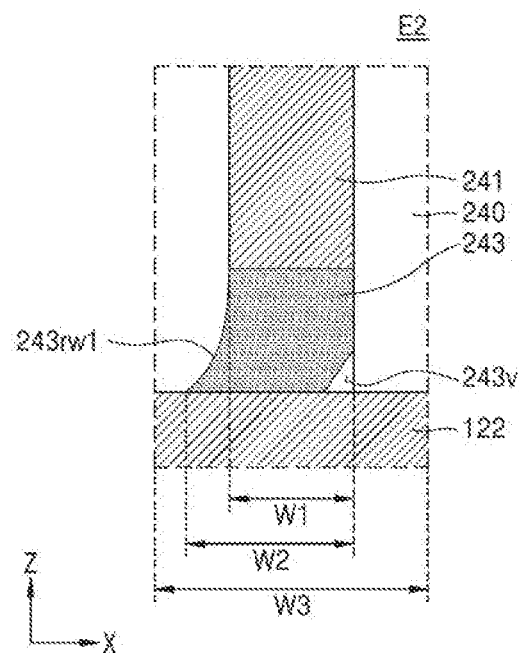
Figure 2L:
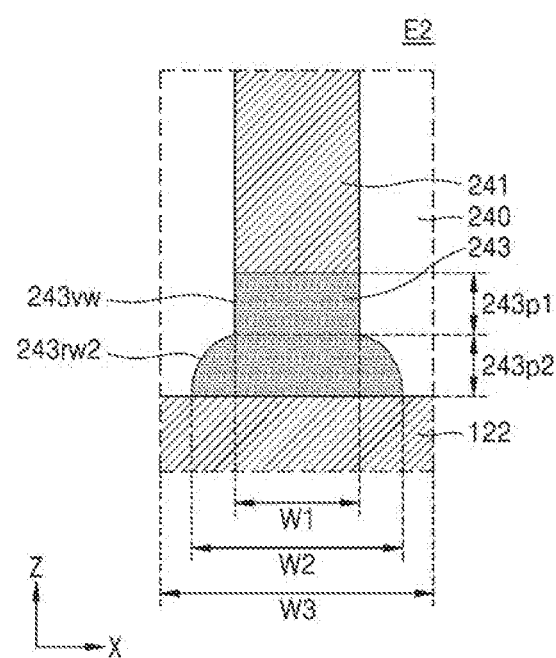
Figure 2M:
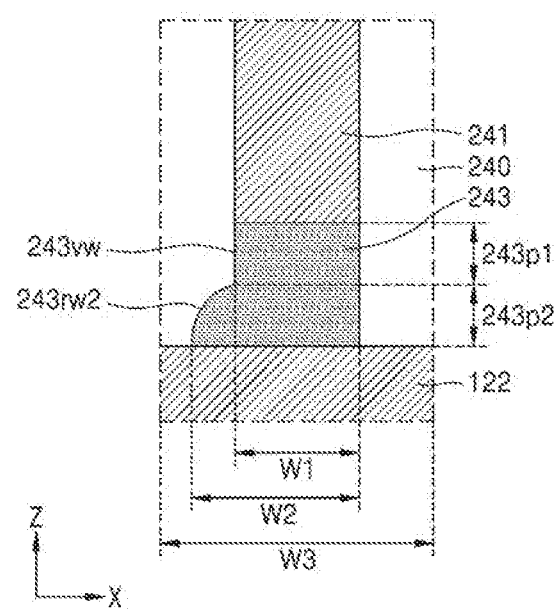
Figure 2N:
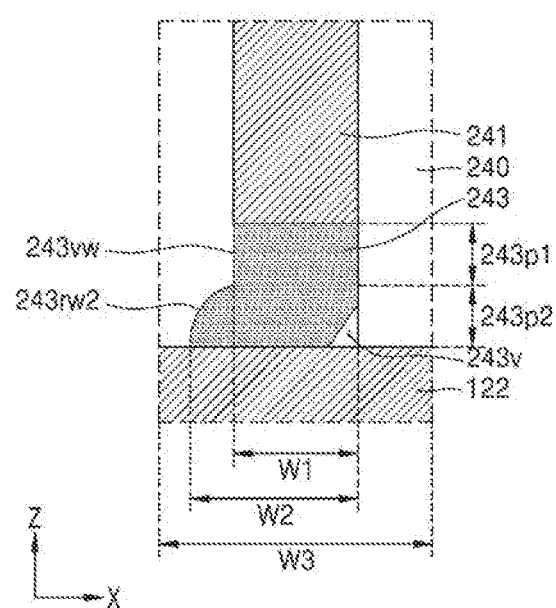
Figure 20:
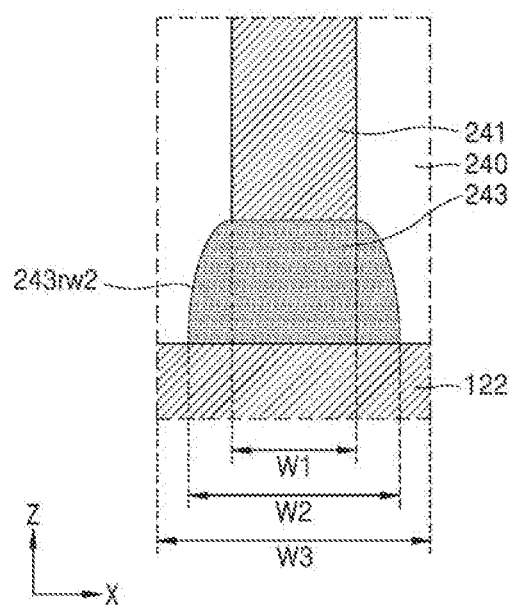
Figure 2P:
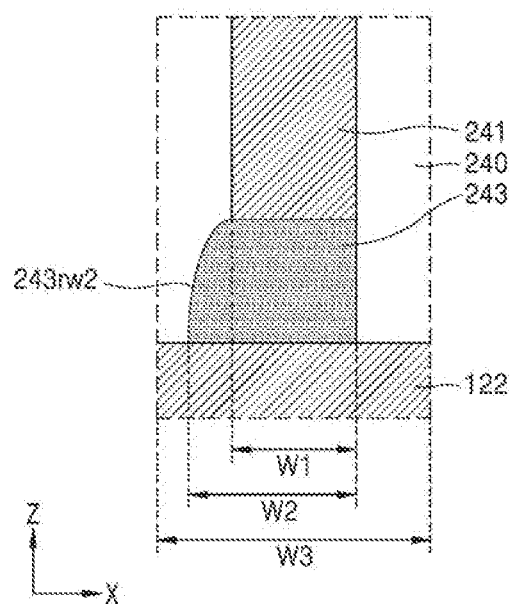
Figure 2Q:
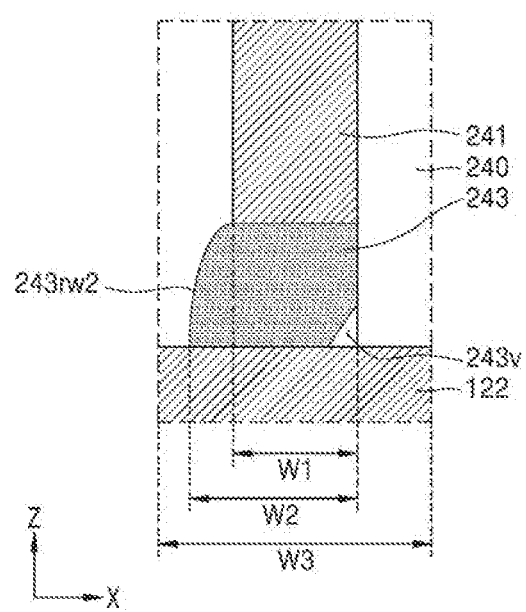

FIGS. 2A to 2Q are partial cross-sectional views illustrating a semiconductor package according to different embodiments.

In more detail, FIGS. 2A to 2Q are partial cross-sectional views corresponding to the region E2 of FIG. 1B and illustrate only one second UBM pattern 241, one second buried solder 243, and one first rear surface pad 122, for conciseness.

Since the semiconductor package of FIGS. 2A to 2Q is the same as the semiconductor chip stack structure 10 of FIGS. A to 1C excluding a shape of the second buried solder 243, previously given description is omitted for conciseness and structural characteristics of the second buried solder 243 will be mainly described.

Referring to FIG. 2A, the second buried solder 243 may include the first portion 243p1 having a constant cross-sectional area and a second portion 243p2 having a cross-sectional area that increases as a distance from the first rear surface pad 122 decreases. However, in contrast with the embodiment shown in FIG. 1C, the second portions 243p2 of the second buried solder 243 may protrude from the first portion 243p1 only to one side in the X direction and may not protrude to the other side. Therefore, at least a part of the second portion 243p2 of the second buried solder 243 may have a vertical side wall that runs parallel to a vertical side wall of the first portion 243p1 in the Z direction. A horizontal cross-sectional area of the second buried solder 243 may constantly change in the Z direction. Therefore, the center of the second buried solder 243 may not vertically overlap the center of the second UBM pattern 241. In other words, the second buried solder 243 may not have rotational symmetry with respect to an axis that runs parallel in the Z direction.

Referring to FIG. 2B, a void 243*v* may be formed between the second portion 243*p*2 of the second buried solder 243 and the second polymer layer 240. The void 243*v* may have various shapes and sizes. According to some embodiments, although the void 243*v* is formed, the second buried solder 243 may have a maximum cross-sectional area on a surface that meets the first rear surface pad 122. According to some embodiments, a change in the horizontal cross-sectional area of the second portion 243*p*2 of the second buried solder 243 may vary in accordance with the void 243*v*. In more detail, a change in the horizontal cross-sectional area of the second portion 243*p*2 of the second buried solder 243 on the void 243*v* may be greater than a change in the horizontal cross-sectional area of the second portion 243*p*2 of the second buried solder 243 at the same level as that of the void 243*v*. In other words, an angle β between the first rear surface pad 122 and an edge of the second buried solder 243 forming the void 243*v* may be greater than an angle α between the first rear surface pad 122 and the second buried solder 243 opposite the void 243*v*.

Referring to FIG. 2C, the second buried solder 243 may inclined side walls 243*sw* unlike in FIG. 1C in that the second buried solder 243 may not include the vertical side wall 243*vw* illustrated in FIG. 1C. In an etching process of the second polymer layer 240 described later, by controlling average energy, energy distribution, and etching time of plasma that etches the second polymer layer 240, a profile of the second polymer layer 240 may be controlled. According to some embodiments, a change in a horizontal cross-section of the second buried solder 243 may be constant.

An embodiment of FIG. 2D corresponds to that of FIG. 2A. In other words, the embodiment illustrated in FIG. 2D may be a combination of the embodiments shown in FIGS. 2A and 2C. The second buried solder 243 may have a vertical side wall that runs parallel over the second buried solder 243 in the Z direction.

An embodiment of FIG. 2E corresponds to that of FIG. 2B. In other words, the embodiment illustrated in FIG. 2E may be a combination of the embodiments shown in FIGS. 2B and 2C. The void 243*v* may be formed between the second buried solder 243 and the second polymer layer 240.

Referring to FIG. 2F, the second buried solder 243 may include the first portion 243*p*1 having the horizontal cross-sectional area constant in the Z direction and the second portion 243*p*2 having the horizontal cross-sectional area changing in the Z direction. According to some embodiments, a rate of change of the horizontal cross-sectional area of the second portion 243*p*2 of the second buried solder 243 may change in the Z direction. According to some embodiments, the second buried solder 243 may have concave round side walls 243*rw*1. Therefore, a rate of change of the horizontal cross-sectional area of the second buried solder 243 may increase as a distance from the first rear surface pad 122 increases.

An embodiment of FIG. 2G corresponds to that of FIG. 2A. In other words, the embodiment illustrated in FIG. 2G may be a combination of the embodiments shown in FIGS. 2A and 2F. The second buried solder 243 may have a vertical side wall on one side that runs parallel over the second buried solder 243 in the Z direction.

An embodiment of FIG. 2H corresponds to that of FIG. 2B. In other words, the embodiment illustrated in FIG. 2H may be a combination of the embodiments shown in FIGS. 2B and 2F. The void 243*v* may be formed between the second buried solder 243 and the second polymer layer 240.

Referring to FIG. 2I, the second buried solder 243 may include round side walls 243*rw*. The round side walls 243*rw*1 may be concave and may extend from a lower surface of the second buried solder 243, that is, a surface that contacts the first rear surface pad 122, to an upper surface of the second buried solder 243, that is, a surface that contacts the second UBM pattern 241.

An embodiment of FIG. 2J corresponds to that of FIG. 2A. In other words, the embodiment illustrated in FIG. 2J may be a combination of the embodiments shown in FIGS. 2A and 2I. The second buried solder 243 may have a vertical side wall on one side that runs parallel over the second buried solder 243 in the Z direction.

An embodiment of FIG. 2K corresponds to that of FIG. 2B. In other words, the embodiment illustrated in FIG. 2K may be a combination of the embodiments shown in FIGS. 2B and 2I. The void 243*v* may be formed between the second buried solder 243 and the second polymer layer 240.

Referring to FIG. 2L, the second buried solder 243 may include the first portion 243*p*1 having the horizontal cross-sectional area constant in the Z direction and the second portion 243*p*2 having the horizontal cross-sectional area changing in the Z direction. According to some embodiments, the rate of change of the horizontal cross-sectional area of the second portion 243*p*2 of the second buried solder 243 may change in the Z direction. According to some embodiments, the second buried solder 243 may have convex round side walls 243*rw*2. Therefore, the rate of change of the horizontal cross-sectional area of the second buried solder 243 may be decrease as a distance from the first rear surface pad 122 decreases.

An embodiment of FIG. 2M corresponds to that of FIG. 2A. In other words, the embodiment illustrated in FIG. 2M may be a combination of the embodiments shown in FIGS. 2A and 2L. The second buried solder 243 may have a vertical side wall on one side that runs parallel over the second buried solder 243 in the Z direction.

An embodiment of FIG. 2N corresponds to that of FIG. 2B. In other words, the embodiment illustrated in FIG. 2N may be a combination of the embodiments shown in FIGS. 2B and 2L. The void 243*v* may be formed between the second buried solder 243 and the second polymer layer 240.

Referring to FIG. 2O, the second buried solder 243 may include round side walls 243*rw*2. The round side walls 243*rw*2 may be convex and may extend from the lower surface of the second buried solder 243, that is, the surface that contacts the first rear surface pad 122, to the upper surface of the second buried solder 243, that is, the surface that contacts the second UBM pattern 241.

An embodiment of FIG. 2P corresponds to that of FIG. 2A. In other words, the embodiment illustrated in FIG. 2P may be a combination of the embodiments shown in FIGS. 2A and 2O. The second buried solder 243 may have a vertical side wall on one side that runs parallel over the second buried solder 243 in the Z direction.

An embodiment of FIG. 2Q corresponds to that of FIG. 2B. In other words, the embodiment illustrated in FIG. 2Q may be a combination of the embodiments shown in FIGS. 2B and 2O. The void 243*v* may be formed between the second buried solder 243 and the second polymer layer 240.

Figure 3:
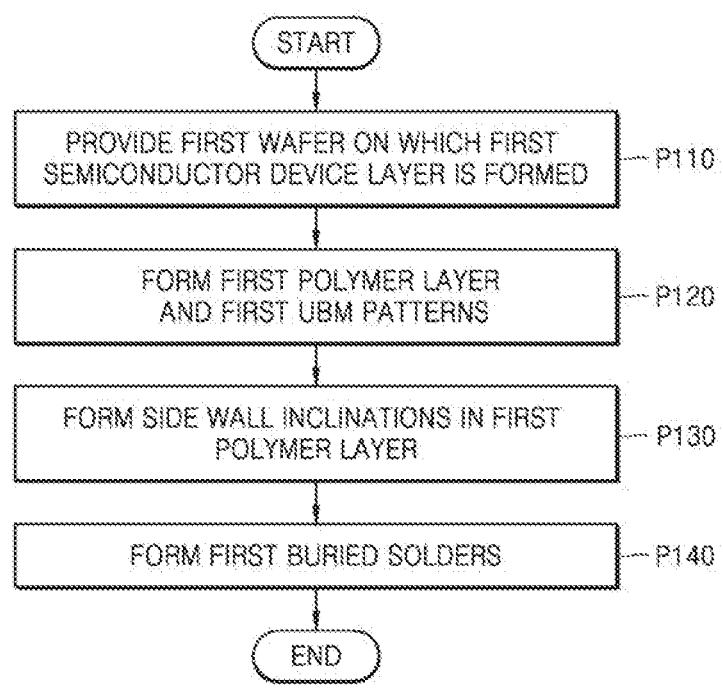
FIG. 3 is a flowchart illustrating a method of manufacturing a semiconductor package, according to some embodiments.

FIG. 3 is a flowchart illustrating a method of manufacturing a semiconductor package, according to some embodiments.

FIGS. 4 to 7 are cross-sectional views illustrating a method of manufacturing a semiconductor package, according to some embodiments. Here, FIGS. 6A to 6D are partial cross-sectional views illustrating an enlargement of the portion E3 of FIG. 5.

Figure 4:
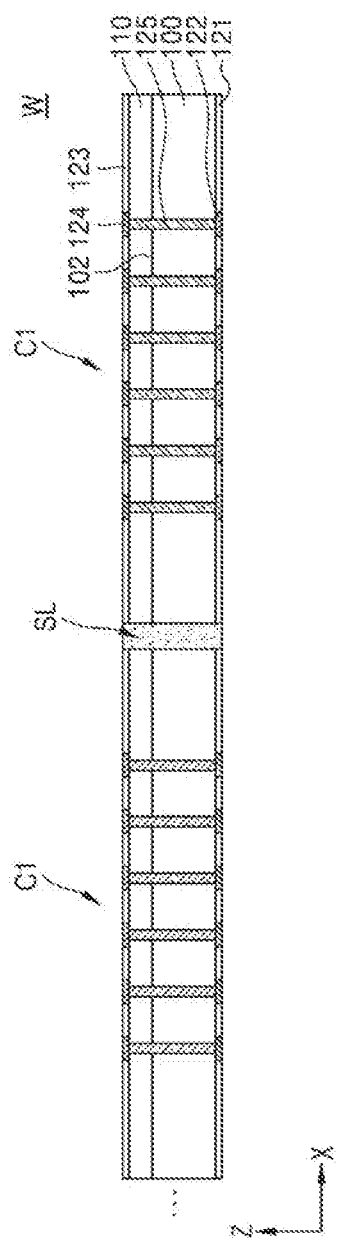
FIGS. 4 to 7 are cross-sectional views illustrating a method of manufacturing a semiconductor package, according to some embodiments.

Referring to FIGS. 3 and 4, in P110, a first wafer W on which the first semiconductor device layer 110 is formed may be provided.

The wafer W may include a plurality of first semiconductor chips C1 separated from each other with a scribe lane SL interposed therebetween. The first semiconductor chip C1 may include the first semiconductor substrate 100, the first semiconductor device layer 110, the first through electrodes 125, the first rear surface insulating layer 121, the first rear surface pads 122, the first front surface insulating layer 123, and the first front surface pads 124. The first semiconductor substrate 100 may include the active surface and the non-active surface that are opposite to each other. The first semiconductor device layer 110 may be formed on the active surface of the first semiconductor substrate 100. The first through electrodes 125 may pass through the first semiconductor substrate 100 and the first semiconductor device layer 110.

The first semiconductor device layer 110 may include the system LSI, the flash memory, the DRAM, the SRAM, the EEPROM, the PRAM, the MRAM, or the ReRAM. The first semiconductor device layer 110 may include a plurality of wiring structures for connecting the plurality of individual devices to other wiring lines formed on the first semiconductor substrate 100.

The first through electrodes 125 may extend from a first upper surface 102 of the first semiconductor substrate 100 to an inside of the first semiconductor substrate 100. At least parts of the first through electrodes 125 may be pillar-shaped. In some embodiments, the first through electrodes 125 may be formed of a barrier layer formed on surfaces of pillar-shapes and a buried conductive layer that fills an inside of the barrier layer. In some embodiments, a via insulating layer may be interposed between the first semiconductor substrate 100 and the first through electrodes 125. The via insulating layer may include an oxide layer, a nitride layer, a carbide layer, a polymer, or a combination of these layers.

Figure 5:
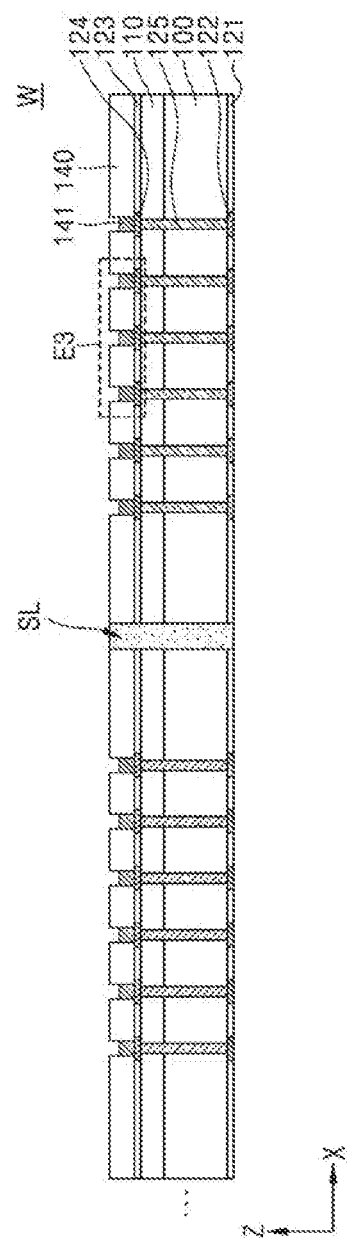

Referring to FIGS. 3 and 5, in P120, the first polymer layer 140 and the first UBM patterns 141 may be formed.

According to some embodiments, the first polymer layer 140 may include various polymers. The first polymer layer 140 may be formed by, for example, spin coating. However, the inventive concept is not limited thereto. The first polymer layer 140 may be formed by a process such as atomic layer deposition (ALD), chemical vapor deposition (CVD), plasma-enhanced CVD (PECVD), metal organic CVD (MOCVD), physical vapor deposition (PVD), reactive pulsed laser deposition, molecular beam epitaxy, or direct current (DC) magnetron sputtering.

In some embodiments, the first polymer layer 140 may include an uncured polymer. The first polymer layer 140 may be cured when the first polymer layer 140 is bonded with an external substrate or chip such as a package substrate, a logic chip, or an interposer substrate. According to some embodiments, the first polymer layer 140 may include a photosensitive material and, in this case, may be patterned by a development process.

According to some embodiments, the first polymer layer 140 may include a non-photosensitive material and may be patterned by using an additional photoresist pattern. The patterning of the first polymer layer 140 may be performed by plasma etching such as argon (Ar) plasma. However, the inventive concept is not limited thereto. Here, patterning the first polymer layer 140 means exposing the first front surface pads 124 by removing at least a part of the first polymer layer 140.

The first UBM patterns 141 may be formed by, for example, electroplating. The first UBM patterns 141 may include at least one of Sn, Ti, vanadium (V), Sb, Pb, W, Cr, Cu, Ni, Al, Pd, Ag, or Au.

Figure 6A:
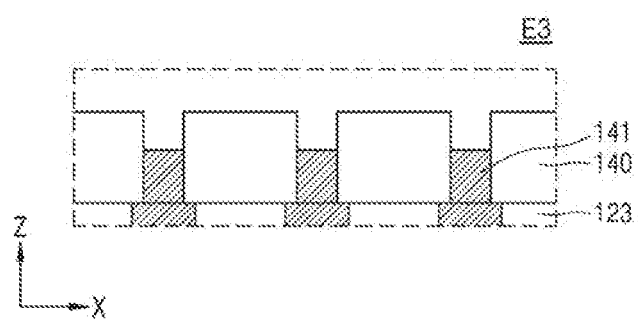
Figure 6B:
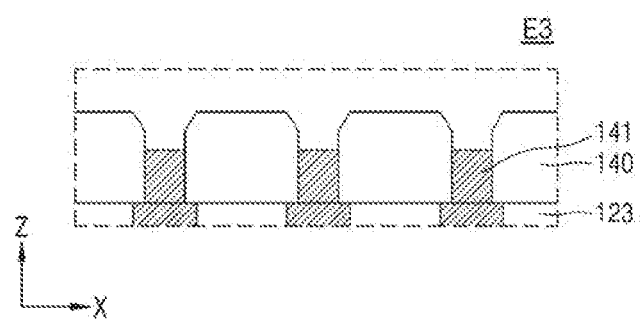

Referring to FIGS. 3, 6A, and 6B, in P130, side wall inclinations may be formed in the first polymer layer 140.

Forming the side wall inclinations in the first polymer layer 140 may be performed by plasma etching such as Ar plasma etching. According to some embodiments, since plasma etching does not have sufficient energy to remove a metal pattern, the first UBM patterns 141 may not be affected by plasma etching. Therefore, in a process of forming the inclinations in the first polymer layer 140, upper portions of the first UBM patterns 141 may not be removed.

According to some embodiments, by adjusting process parameters such as a process temperature and process time of a plasma etching process, average energy of plasma, a kind of plasma, and energy distribution of plasma, the side wall inclinations of the first polymer layer 140 may have various profiles. For example, FIGS. 1C and 2A to 2Q illustrate various side wall inclination profiles according to the various embodiments discussed above. By properly selecting the process parameters of the plasma etching process, a side wall inclination profile of the first polymer layer 140 according to one of the side wall inclination profiles illustrated in FIGS. 1C and 2A to 2Q may be implemented. FIG. 6B illustrates the side wall inclination profile of FIG. 1C as an example.

Figure 6C:
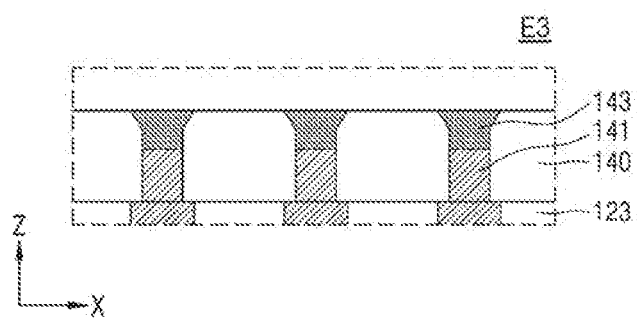

Referring to FIGS. 3 and 6C, in P140, the first buried solders 143 may be formed. The first buried solders 143 may be formed by the damascene process. In more detail, after forming a material layer formed of Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, and/or Sn—Bi—Zn on the first polymer layer 140 in which the side wall inclinations are formed, by performing a chemical mechanical polish (CMP) in which the upper surface of the first polymer layer 140 is an end point of etching, the first buried solders 143 may be formed. Shapes of side walls of the first buried solders 143 may be determined by the side wall inclinations formed in the first polymer layer 140.

Figure 7:
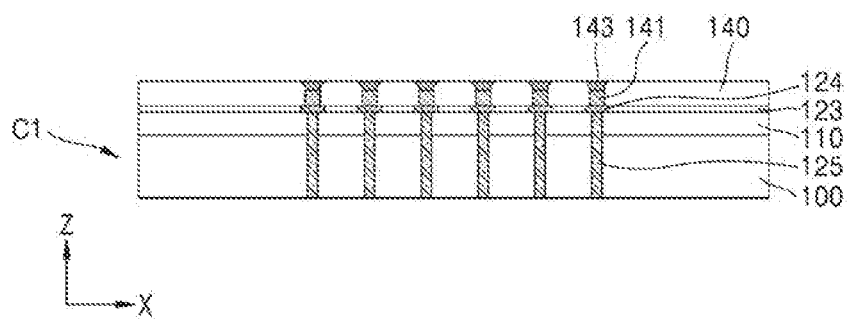

Referring to FIG. 7, the first semiconductor chip C1 may be individualized by separating the first semiconductor chips C1 along the scribe lanes SL. The first semiconductor chips C1 may be separated by a separation unit such as a blade or a laser.

A method of manufacturing the first semiconductor chip C1 is described above. However, those skilled in the art will understand from this description that the second to fourth semiconductor chips C2, C3, and C4 illustrated in FIG. 1B may be formed by the same method based on the above description.

Referring to FIG. 1B again, the first semiconductor chip stack structure 10 may be formed by stacking the first to fourth semiconductor chips C1, C2, C3, and C4.

According to some embodiments, in a thermo-compression bonding (TCB) process of forming the first semiconductor chip stack structure 10, an inclination profile of one of the second to fourth polymer layers 240, 340, and 440 or the second to fourth buried solders 243, 343, and 443 may change. Therefore, side wall inclinations of the second to fourth buried solders 243, 343, and 443 may be rounded, the void 243v may be formed, and/or the second to fourth buried solders 243, 343, and 443 may be recessed toward centers thereof.

Figure 8:
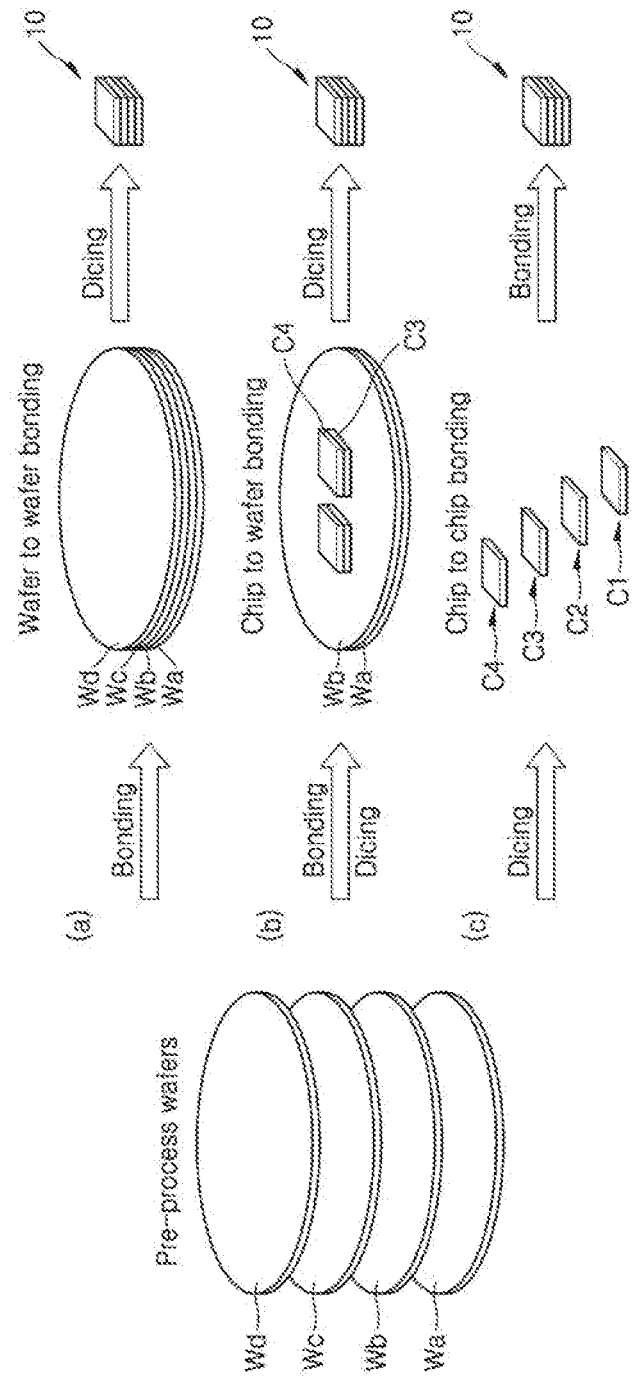
FIG. 8 is a conceptual diagram illustrating a method of manufacturing a semiconductor device, according to some embodiments.

FIG. 8 is a conceptual diagram illustrating a method of manufacturing a semiconductor device, according to some embodiments.

In FIGS. 3 to 7, chip to chip (or die to die) bonding in which, after the semiconductor chips are individualized as illustrated in (c) of FIG. 8, the individualized semiconductor chips are bonded is described. However, the inventive concept is not limited thereto.

Referring to FIG. 8, first to fourth wafers Wa, Wb, Wc, and Wd may be formed as described with reference to FIGS. 3 to 6C. In some embodiments, in accordance with the arrow (a), the first to fourth wafers Wa, Wb, Wc, and Wd may be bonded at a wafer level by a TCB method and then, may be individualized to the semiconductor chip stack structure 10. In other embodiments, in accordance with the arrow (c), after the first to fourth semiconductor chips C1 to C4 are formed by individualizing the first to fourth wafers Wa, Wb, Wc, and Wd as illustrated in FIG. 7, by bonding the first to fourth semiconductor chips C1 to C4 by the TCB method, the semiconductor chip stack structure 10 may be formed. In still other embodiments, in accordance with the arrow (b), the semiconductor chip stack structure 10 may be formed by wafer to wafer bonding the first and second wafers Wa and Wb, previously individualizing the third and fourth wafers Wc and Wd, and bonding the third and fourth wafers Wc and Wd at a chip level. Then, after mounting a stack structure including the third and fourth semiconductor chips C3 and C4 on a stack structure of the first and second wafers Wa and Wb and then, performing chip to wafer bonding, the third and fourth semiconductor chips C3 and C4 may be individualized.

Figure 9:
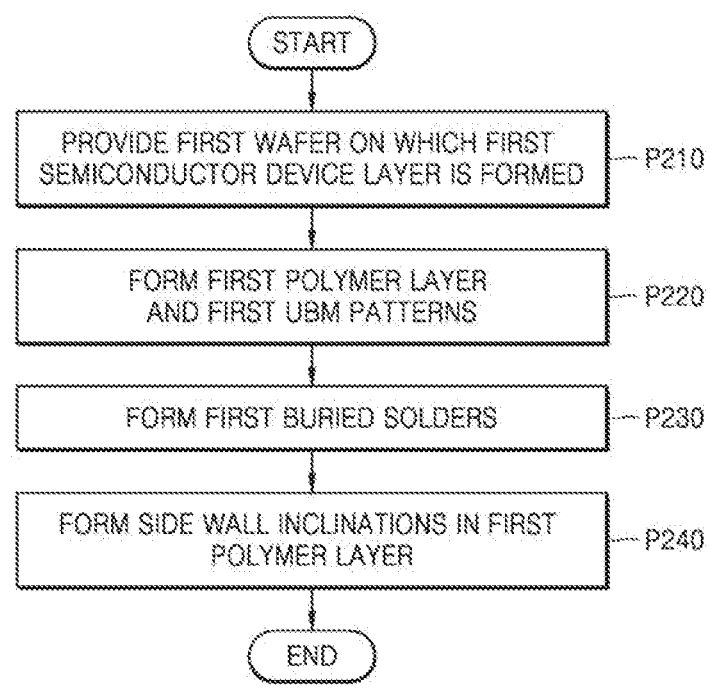
FIG. 9 is a flowchart illustrating a method of manufacturing a semiconductor package, according to some embodiments.

FIG. 9 is a flowchart illustrating a method of manufacturing a semiconductor package, according to some embodiments.

P210 and P220 of FIG. 9 are the same as P110 and P120 of FIG. 3, and therefore a respected description thereof is omitted for conciseness.

Figure 10:
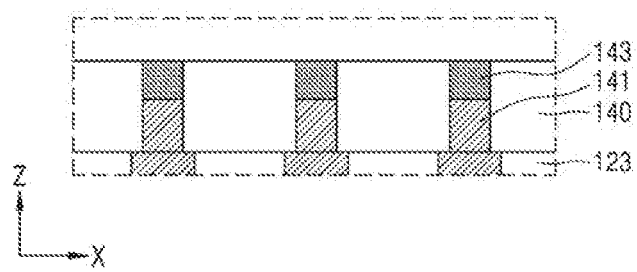
FIGS. 10 and 11 are views illustrating a method of manufacturing a semiconductor package, according to some embodiments.
Figure 11:
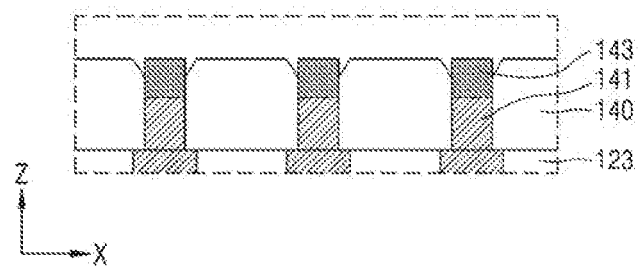

FIGS. 10 and 11 are views illustrating a method of manufacturing a semiconductor package, according to some embodiments. In more detail, FIGS. 10 and 11 are partial cross-sectional views corresponding to FIGS. 6A to 6C.

Referring to FIGS. 9 and 10, in P230, the first buried solders 143 may be formed. The first buried solders 143 may be formed by the damascene process as described with reference to FIG. 6C. Unlike in FIG. 6C, in FIG. 10, before side wall inclinations are formed in the first polymer layer 140, the first buried solders 143 may be formed.

Then, referring to FIGS. 9 and 11, in P240, side wall inclinations may be formed in the first polymer layer 140.

Forming the side wall inclinations in the first polymer layer 140 may be the same as described with reference to FIGS. 3, 6A, and 6B, and therefore a repeated description thereof is omitted for conciseness.

While the first polymer layer 140 is etched by plasma, since the first buried solders 143 are not affected, upper portions of the first buried solders 143 may not be removed.

By such a method, the first to fourth semiconductor chips C1, C2, C3, and C4 of FIG. 1B may be formed. By the TCB method, the first to fourth semiconductor chips C1, C2, C3, and C4 may be bonded. At this time, since heat and pressure are applied to the second to fourth polymer layers 240, 340, and 440 and the second to fourth buried solders 243, 343, and 443, a void may be omitted when the second to fourth buried solders 243, 343, and 443 are bonded to the first to third rear surface pads 122, 222, and 322 in the order.

Figure 12:
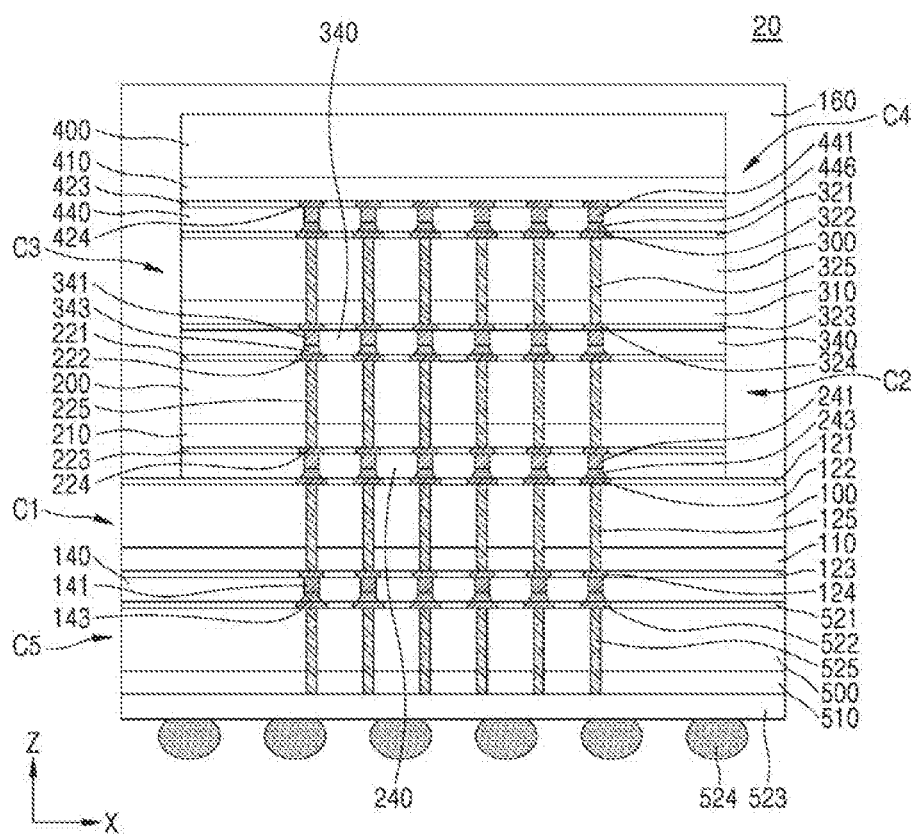
FIG. 12 is a cross-sectional view illustrating a semiconductor package according to some other embodiments.

FIG. 12 is a cross-sectional view illustrating a semiconductor package 20 according to some other embodiments.

For convenience sake, description previously given with reference to FIGS. 1A to 1C is omitted for conciseness and differences with FIGS. 1A to 1C will be mainly described.

According to some embodiments, the semiconductor package 20 may include first to fifth semiconductor chips C1, C2, C3, C4, and C5 and external connection terminals 524. Since the first to fourth semiconductor chips C1, C2, C3, and C4 are the same as the first to fourth semiconductor chips C1, C2, C3, and C4 of FIG. 1B, detailed description thereof will not be given for conciseness.

According to some embodiments, the semiconductor package 20 may be a hybrid package. The first to fourth semiconductor chips C1, C2, C3, and C4 may be memory devices or DRAM devices for implementing the HBM.

According to some embodiments, the fifth semiconductor chip C5 may include a fifth semiconductor substrate 500, a fifth semiconductor device layer 510, a fifth rear surface insulating layer 521, fifth rear surface pads 522, a rewiring layer 523, and the external connection terminals 524.

According to some embodiments, by stacking the first to fourth semiconductor chips C1, C2, C3, and C4 that are memory chips and logic chips, since localized calculation and operation processing may be performed, this configuration is advantageous to implementation of deep learning. An operation in the deep learning may be performed by a field programmable gate array (FPGA), a graphics processing unit (GPU), and a central processing unit (CPU). However, as illustrated in FIG. 12, when a logic layer in the semiconductor package 20, that is, the fifth semiconductor chip C5 is used, since an operation processing amount per watt may be increased in a high memory bandwidth, an energy consumption amount may be reduced.

Figure 13A:
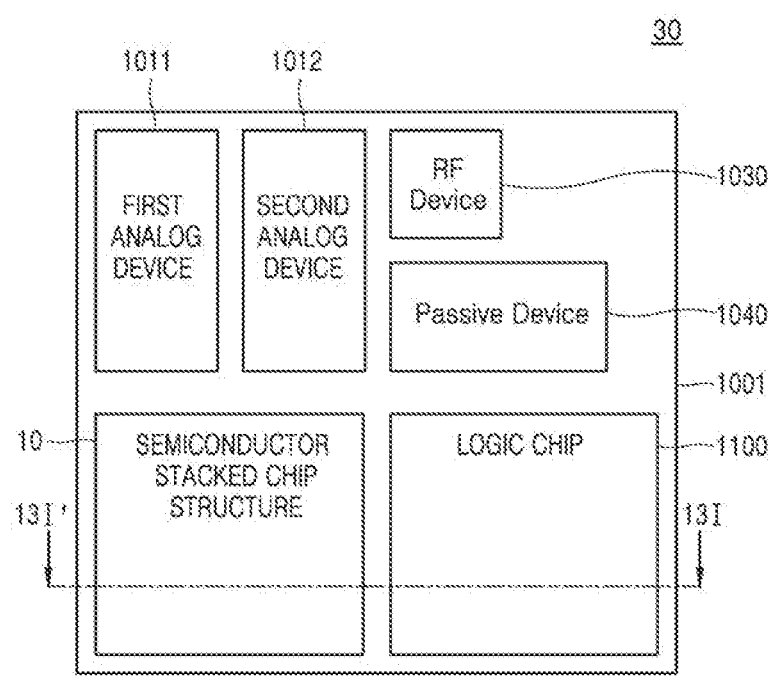
FIG. 13A is a plan view illustrating a semiconductor package according to some other embodiments.

FIG. 13A is a plan view illustrating a semiconductor package 30 according to some other embodiments.

Figure 13B:
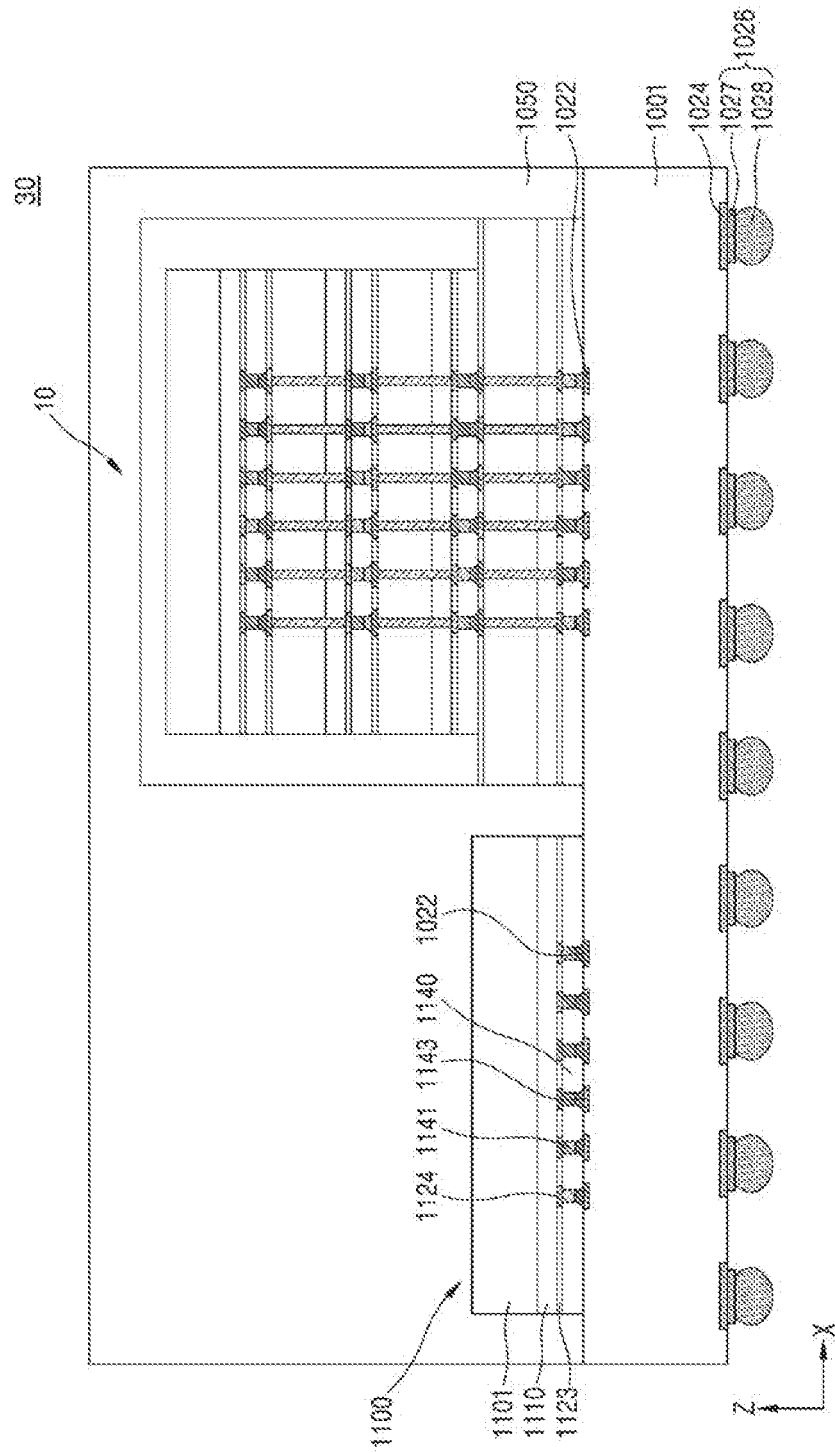
FIG. 13B is a cross-sectional view taken along the line 13I-13I' of FIG. 13A.

FIG. 13B is a cross-sectional view taken along the line 13I-13I' of FIG. 13A.

Referring to FIGS. 13A and 13B, the semiconductor package 30 may include a first analog device 1011 and a second analog device 1012, a radio frequency (RF) device 1030, a passive device 1040, the semiconductor chip stack structure 10, a logic chip 1100, a package substrate 1001, and an external connection terminal 1026.

The semiconductor chip stack structure 10 is the same as described with reference to FIGS. 1A to 1C, and therefore a repeated description thereof is omitted for conciseness.

The package substrate 1001 may be, for example, a printed circuit board (PCB), a ceramic substrate, or an interposer. When the package substrate 1001 is the PCB, the package substrate 1001 may include a substrate base and upper surface pads 1022 and lower surface pads 1024 respectively formed on an upper surface and a lower surface of the substrate base. The upper surface pads 1022 and the lower surface pads 1024 may be exposed by a solder resist layer that covers the upper surface and the lower surface of the substrate base. The substrate base may be formed of at least one material of phenol resin, epoxy resin, or polyimide. For example, the substrate base may include at least one material of FR4, tetrafunctional epoxy, polyphenylene ether, epoxy/polyphenylene oxide, bismaleimide triazine (BT), thermount, cyanate ester, polyimide, or liquid crystal polymer. The upper surface pads 1022 and the lower surface pads 1024 may be formed of Cu, Ni, stainless steel, or beryllium copper. An internal wiring line electrically connected to the upper surface pads 1022 and the lower surface pads 1024 may be formed in the substrate base. The upper surface pads 1022 and the lower surface pads 1024 may be portions exposed by the solder resist layer in a circuit wiring line patterned after coating the upper surface and the lower surface of the substrate base with Cu foil.

When the package substrate 1001 is the interposer, the package substrate 1001 may include the substrate base formed of a semiconductor material and the upper surface pads 1022 and the lower surface pads 1024 respectively formed on the upper surface and the lower surface of the substrate base. The substrate base may be formed of, for example, a silicon wafer. An internal wiring line may be formed on the upper surface of the substrate base, on the lower surface of the substrate base, or in the substrate base. In addition, through vias that electrically connect the upper surface pads 1022 and the lower surface pads 1024 may be formed in the substrate base.

The external connection terminal 1026 may be attached to a lower surface of the package substrate 1001. The external connection terminal 1026 may be attached onto, for example, the lower surface pads 1024. The external connection terminal 1026 may be, for example, solder balls or bumps. The external connection terminal 1026 may electrically connect the semiconductor package 30 to an external device. For example, the external connection terminal 1026 may include UBM patterns 1027 arranged on the lower surface pads 1024 and solder balls 1028 arranged on the UBM patterns 1027. The external connection terminal 1026 may further include external connection pillars arranged between the UBM patterns 1027 and the solder balls 1028. The external connection pillars may include, for example, Cu.

The UBM patterns 1027 may include the same material as described in FIGS. 1A to 1C with reference to the first to fourth UBM patterns 141, 241, 341, and 441. In exemplary embodiments, the external connection terminal 1026 may have a width and/or a height greater than widths and/or heights of the first to fourth buried solders 143, 243, 343, and 443 (refer to FIG. 1B). In some embodiments, the area of the external connection terminal 1026 may be greater than the areas of the first to fourth buried solders 143, 243, 343, and 443. In some embodiments, a horizontal width of the external connection terminal 1026 may be no less than about 20 μm. In other embodiments, the horizontal width of the external connection terminal 1026 may be no less than about 50 μm. In some embodiments, a vertical height (a height in the Z direction) of the external connection terminal 1026 may be no less than about 20 μm. In other embodiments, the vertical height (the height in the Z direction) of the external connection terminal 1026 may be no less than about 50 μm. However, the inventive concept is not limited thereto.

The RF device 1030 may be an antenna device for transmitting and receiving a radio wave of a radio frequency and may include a plurality of filters. The RF device 1030 may operate in various wireless communication environments such as a 3G wireless communication environment, a 4G wireless communication environment, and/or a 5G wireless communication environment.

The passive device 1040 may include an impedance device for impedance matching or a multi-layer ceramic capacitor (MLCC) for blocking noise.

In the semiconductor package 30, on the package substrate 1001, a molding member 1050 that surrounds parts or all of the first and second analog devices 1011 and 1012, the RF device 1030, the passive device 1040, the semiconductor chip stack structure 10, and the logic chip 1100 may be formed. The molding member 1050 may be formed of, for example, the EMC.

The logic chip 1100 may include a logic substrate 1101, a logic device layer 1110, a front surface insulating layer 1023, front surface pads 1124, a polymer layer 1140, UBM patterns 1141, and buried solders 1143. The logic chip 1100 may be the same as the fifth semiconductor chip C5 of FIG. 12 except that the through vias, the rear surface pads, and the rear surface insulating layer illustrated in FIG. 12 are omitted.

Figure 14:
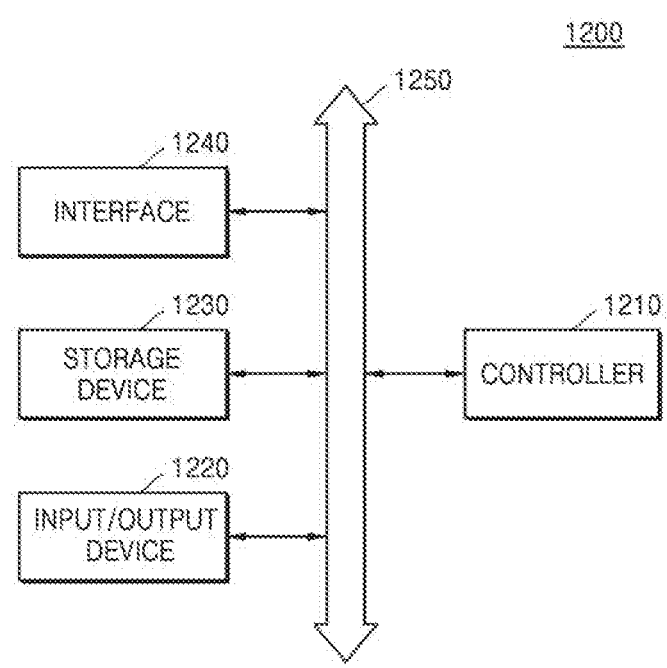
FIG. 14 is a block diagram illustrating a system implemented by a semiconductor package according to some embodiments.

FIG. 14 is a block diagram illustrating a system 1200 implemented by a semiconductor package according to an embodiment.

Referring to FIG. 14, the system 1200 may include a controller 1210, an input/output device 1220, a storage device 1230, and an interface 1240. According to some embodiments, the system 1200 may include or may be implemented by at least one of the semiconductor chip stack structure 10 of FIGS. 1A to 1C, the semiconductor package 20 of FIG. 12, or the semiconductor package 30 of FIGS. 13A and 13B.

The system 1200 may be a mobile system or a system for transmitting or receiving information. In some embodiments, the mobile system is a personal digital assistant (PDA), a portable computer, a web tablet, a wireless phone, a mobile phone, a digital music player, or a memory card.

The controller 1210 for controlling an execution program in the system 1200 may include a microprocessor, a digital signal processor, a microcontroller, or a similar device.

The input/output device 1220 may input or output data of the system 1200. The system 1200 may be connected to an external device, for example, a personal computer (PC) or a network by using the input/output device 1220 and may exchange data with the external device. The input/output device 1220 may be, for example, a keypad, a keyboard, or a display.

The storage device 1230 may store a code and/or data for operating the controller 1210 or data processed by the controller 1210.

The interface 1240 may be a data transmission path between the system 1200 and another external device. The controller 1210, the input/output device 1220, the storage device 1230, and the interface 1240 may communicate with each other through a bus 1250. The system 1200 may be included in a mobile phone, an MP3 player, a navigation, a portable multimedia player (PMP), a solid state disk (SSD), or household appliances.

While the inventive concept has been particularly shown and described with reference to various embodiments thereof, it will be understood that various changes in form and details may be made therein without departing from the spirit and scope of the following claims.

What is claimed is:

1. A semiconductor chip stack structure comprising:
   a first semiconductor chip comprising:
   a first semiconductor substrate having an active surface and a non-active surface opposite to the active surface;
   a first semiconductor device layer formed on the active surface and including a circuit pattern;
   a first rear surface insulating layer formed on the non-active surface;
   a plurality of first rear surface pads formed at a same level as the first rear surface insulating layer;
   a first front surface insulating layer formed on the first semiconductor device layer and spaced apart from the first semiconductor substrate with the first semiconductor device layer interposed therebetween;
   a plurality of first front surface pads formed at a same level as the first front surface insulating layer;
   a plurality of first through electrodes configured to pass through the first semiconductor substrate and the first semiconductor device layer and to be electrically connected to the plurality of first rear surface pads, respectively, and the plurality of first front surface pads, respectively;

a first polymer layer formed on the first front surface insulating layer;

a plurality of first under bump metallurgy (UBM) patterns buried in the first polymer layer; and a plurality of first buried solders formed on the plurality of first UBM patterns, respectively, and buried in the first polymer layer; and a second semiconductor chip comprising:

a second semiconductor substrate having an active surface and a non-active surface opposite to the active surface;

a second semiconductor device layer formed on the active surface of the second semiconductor substrate and including a circuit pattern;

a second front surface insulating layer formed on the second semiconductor device layer and spaced apart from the second semiconductor substrate with the second semiconductor device layer interposed therebetween;

a plurality of second front surface pads formed at a same level as the second front surface insulating layer;

a second polymer layer formed on the second front surface insulating layer;

a plurality of second UBM patterns buried in the second polymer layer; and a plurality of second buried solders formed on the plurality of second UBM patterns, respectively, and buried in the second polymer layer, wherein the second semiconductor chip is on the first semiconductor chip;

wherein a lower surface of the plurality of second buried solders is coplanar with a lower surface of the second polymer layer, the lower surface of the second polymer layer is in contact with the first rear surface insulating layer, and the plurality of second buried solders contact the plurality of first rear surface pads, respectively, wherein a horizontal cross-sectional area of each of the plurality of second buried solders is greatest on a contact surface with the first rear surface pad, wherein the horizontal cross-sectional area is less than a horizontal cross-sectional area of the first rear surface pad, wherein each of the plurality of second buried solders comprises a first portion having a horizontal cross-sectional area that is constant and a second portion having a horizontal cross-sectional area that changes, and wherein the first portion and the second portion of each of the plurality of second buried solders include a same material.

2. The semiconductor chip stack structure of claim 1, wherein
the horizontal cross-sectional area of the second portion increases as a distance from the contact surface with the first rear surface pad decreases.

3. The semiconductor chip stack structure of claim 1, wherein
a rate of change of the horizontal cross-sectional area of the second portion in a first direction perpendicular to the active surface of the second semiconductor substrate is constant.

4. The semiconductor chip stack structure of claim 1, wherein
a rate of change of the horizontal cross-sectional area of the second portion in a first direction perpendicular to the active surface of the second semiconductor substrate decreases as a distance from the contact surface with the first rear surface pad decreases.

5. The semiconductor chip stack structure of claim 1, wherein
a rate of change of the horizontal cross-sectional area of the second portion in a first direction perpendicular to the active surface of the second semiconductor substrate increases as a distance from the contact surface with the first rear surface pad increases.

6. The semiconductor chip stack structure of claim 1, wherein
a pitch of the plurality of second buried solders is no more than 20 µm.

7. The semiconductor chip stack structure of claim 1, wherein
a maximum horizontal width of each of the plurality of second buried solders is no more than 15 µm.

8. The semiconductor chip stack structure of claim 1, wherein
a maximum horizontal width of each of the plurality of second buried solders is less than a horizontal width of respective ones of the plurality of first rear surface pads.

9. The semiconductor chip stack structure of claim 1, wherein each of the plurality of second buried solders is spaced apart from each side surfaces surface of each of the plurality of first rear surface pads.

10. The semiconductor chip stack structure of claim 1, further comprising a molding layer horizontally surrounding the first semiconductor chip, and the second semiconductor chip
wherein a lateral surface of the first polymer layer is coplanar with a lateral surface of a device layer of the first semiconductor chip and a lateral surface of the second polymer layer is coplanar with a lateral surface of a device layer of the second semiconductor chip, and
wherein the molding layer in contact with the lateral surface of the first polymer layer and the lateral surface of the second polymer layer.

11. A semiconductor chip stack structure comprising a first semiconductor chip and a second semiconductor chip on the first semiconductor chip:
the first semiconductor chip comprising:
a first semiconductor substrate having an active surface and a non-active surface opposite to the active surface;
a first semiconductor device layer formed on the active surface and including a circuit pattern;
a first rear surface insulating layer formed on the non-active surface;
a plurality of first rear surface pads formed at a same level as the first rear surface insulating layer;
a first front surface insulating layer formed on the first semiconductor device layer and spaced apart from the first semiconductor substrate with the first semiconductor device layer interposed therebetween;
a plurality of first front surface pads formed at a same level as the first front surface insulating layer;
a plurality of first through electrodes configured to pass through the first semiconductor substrate and the first semiconductor device layer and to be electrically connected to the plurality of first rear surface pads, respectively, and the plurality of first front surface pads, respectively;

a first polymer layer formed on the first front surface insulating layer;

a plurality of first under bump metallurgy (UBM) patterns buried in the first polymer layer; and a plurality of first buried solders formed on the plurality of first UBM patterns, respectively, and buried in the first polymer layer; and the second semiconductor chip comprising:

a second semiconductor substrate having an active surface and a non-active surface opposite to the active surface;

a second semiconductor device layer formed on the active surface of the second semiconductor substrate and including a circuit pattern;

a second front surface insulating layer formed on the second semiconductor device layer and spaced apart from the second semiconductor substrate with the second semiconductor device layer interposed therebetween;

a plurality of second front surface pads formed at a same level as the second front surface insulating layer;

a second polymer layer formed on the second front surface insulating layer;

a plurality of second UBM patterns buried in the second polymer layer; and a plurality of second buried solders formed on the plurality of second UBM patterns, respectively, and buried in the second polymer layer, wherein a lower surface of the plurality of second buried solders is coplanar with a lower surface of the second polymer layer, the lower surface of the second polymer layer is in contact with the first rear surface insulating layer, wherein the plurality of second buried solders contact the plurality of first rear surface pads, respectively, wherein each of the plurality of second buried solders comprises a first portion having a horizontal cross-sectional area that is constant and a second portion having a horizontal cross-sectional area that changes, wherein the first portion and the second portion of each of the plurality of second buried solders include a same material, and wherein the horizontal cross-sectional area of the second portion of each of the plurality of second buried solders increases as a distance from a contact surface with the first rear surface pad decreases, and the horizontal cross-sectional area of each of the plurality of second buried solders is less than a horizontal cross-sectional area of the first rear surface pad.

12. The semiconductor chip stack structure of claim 11, wherein the first semiconductor chip includes a logic chip, and the second semiconductor chip include memory chips.

13. The semiconductor chip stack structure of claim 11, wherein the first semiconductor chip comprises a plurality of external connection terminals formed at an opposite side of the second semiconductor chip from the active surface, and wherein a width of the plurality of external connection terminals is greater than a width the plurality of second buried solders.

14. The semiconductor chip stack structure of claim 13, wherein each of the plurality of external connection terminals has a width of no less than 20 μm.

15. The semiconductor chip stack structure of claim 11, wherein a pitch of the plurality of second buried solders is no more than 20 μm.

* * * * *